United States Patent
Nakano et al.

(10) Patent No.: US 8,074,284 B2
(45) Date of Patent: Dec. 6, 2011

(54) DEVICE PROVIDED WITH REWRITABLE CIRCUIT, UPDATING SYSTEM, UPDATING METHOD, UPDATING PROGRAM AND INTEGRATED CIRCUIT

(75) Inventors: Toshihisa Nakano, Osaka (JP); Natsume Matsuzaki, Osaka (JP)

(73) Assignee: Panasonic Corporation, Osaka (JP)

( * ) Notice: Subject to any disclaimer, the term of this patent is extended or adjusted under 35 U.S.C. 154(b) by 477 days.

(21) Appl. No.: 12/303,397

(22) PCT Filed: Jun. 12, 2007

(86) PCT No.: PCT/JP2007/061834
§ 371 (c)(1),
(2), (4) Date: Dec. 4, 2008

(87) PCT Pub. No.: WO2007/145220
PCT Pub. Date: Dec. 21, 2007

(65) Prior Publication Data
US 2010/0002871 A1     Jan. 7, 2010

(30) Foreign Application Priority Data
Jun. 14, 2006   (JP) ................. 2006-164292

(51) Int. Cl.
*H04L 9/32* (2006.01)
(52) U.S. Cl. .............. 726/26; 726/27; 713/193
(58) Field of Classification Search ............ 726/26–27, 726/34; 713/174, 192–194; 326/8, 36, 37
See application file for complete search history.

(56) References Cited

U.S. PATENT DOCUMENTS

| | | | |
|---|---|---|---|
| 6,101,255 | A | 8/2000 | Harrison et al. |
| 6,823,069 | B1 | 11/2004 | Kitajima et al. |
| 7,474,119 | B2 * | 1/2009 | Kanno et al. ............. 326/38 |

FOREIGN PATENT DOCUMENTS

| | | |
|---|---|---|
| JP | 7-176137 | 7/1995 |
| JP | 8-211227 | 8/1996 |
| JP | 10-55135 | 2/1998 |
| JP | 10-132755 | 5/1998 |

(Continued)

OTHER PUBLICATIONS

International Search Report issued Jul. 24, 2007 in the International (PCT) Application of which the present application is the U.S. National Stage.

*Primary Examiner* — Hosuk Song
(74) *Attorney, Agent, or Firm* — Wenderoth, Lind & Ponack, L.L.P.

(57) ABSTRACT

A problem to be solved is that a conventional device is not equipped with a unit that enables efficient circuit update taking into consideration an unconfigured area in the reconfigurable circuit in the device. A data using device of the present invention transmits, to a design data generation apparatus, device information relating to functions and structures of circuits included in the data using device, and receives design data generated by the design data generation apparatus. The data using device updates the function thereof based on the received design data. With this structure, the present invention can provide the data using device and the design data generation apparatus that are capable of managing the configuration of the circuits in the data using device, and acquiring properly the data to update the function thereof.

23 Claims, 17 Drawing Sheets

FOREIGN PATENT DOCUMENTS

| | | |
|---|---|---|
| JP | 10-320191 | 12/1998 |
| JP | 11-17524 | 1/1999 |
| JP | 2000-89963 | 3/2000 |
| JP | 2000-133716 | 5/2000 |
| JP | 2002-300071 | 10/2002 |
| JP | 2005-269187 | 9/2005 |
| JP | 2006-129324 | 5/2006 |

* cited by examiner

FIG.4

| DESIGN DATA LIST | |
|---|---|
| IDENTIFIER | DESIGN DATA |
| A | DESIGN DATA A |
| B | DESIGN DATA B |
| D | DESIGN DATA D |

| FIXED-FUNCTION LOGIC CIRCUIT LIST |
|---|
| FIXED-FUNCTION LOGIC CIRCUIT |
| AES CIRCUIT |
| 32 BIT MULTIPLIER |
| 64 BIT ACCUMULATOR |

FIG.9

| ENCRYPTION ALGORITHM | NECESSARY CAPABILITY | CONTENT NAME |
|---|---|---|
| AES ENCRYPTION | 24 Mbps | ENCRYPTED CONTENT A |

DEVICE PROVIDED WITH REWRITABLE CIRCUIT, UPDATING SYSTEM, UPDATING METHOD, UPDATING PROGRAM AND INTEGRATED CIRCUIT

TECHNICAL FIELD

The present invention relates to a technique to update functions of a device, and more particularly to a technique to effectively utilize a reconfigurable circuit.

BACKGROUND ART

In order to protect a copyright of a content, more specifically to prevent a malicious use of a content, such as unauthorized playing back or copying of the content, a cryptography technology is commonly used and an encrypted content is distributed.

Only an authorized device can hold or obtain a decrypting key to decrypt and play back such an encrypted content.

A cryptography function is often hardware-implemented in a device in view of the processing speed and tamper-resistance. Meanwhile, in order to secure the safety, there is a demand for changing a cryptosystem implemented in the device to another when the cryptosystem is broken.

The patent document 1 discloses a technique that enables a cryptosystem to be updated with use of a reconfigurable hardware device such as a FPGA (Field Programmable Gate Array) and a PLA (programmable logic Array). Also, the patent document 2 discloses a technique in which predetermined encrypting algorithm files are stored in a database, and one of the algorithm files are selected from the database and updated according to an external instruction.

Patent document 1: Japanese Laid-Open Patent Application Publication No. H10-320191
Patent document 2: Japanese Laid-Open Patent Application Publication No. H10-55135

SUMMARY OF THE INVENTION

Problem to be Solved by the Invention

In both of the techniques disclosed in the above-mentioned patent documents, a reconfigurable circuit is reconfigured based on design data according to the instruction from a host device every time update is required, regardless of the current structure of the reconfigurable circuit, a size of an area that has not been used for circuits and a function required by the device. Because of this, a circuit having an unnecessary function for the device might be configured, or an existing circuit might be deleted or overwritten. As a result, there is a possibility that the device cannot obtain a necessary function or a necessary function might be lost, and accordingly a user might suffer inconveniences.

To solve these problems, the present invention aims to provide a device that is equipped with a reconfigurable circuit capable of resolving the above-mentioned inconveniences and obtaining a necessary function for the device, and an updating method, an updating program and an integrated circuit for the same.

Means to Solve the Problem

In order to solve the above problems, the present invention provides a device, comprising: a reconfigurable circuit whose internal circuit structure is reconfigurable; a generation unit operable to generate circuit information that includes at least area information showing an unconfigured area in the reconfigurable circuit; a transmission unit operable to transmit the circuit information generated by the generation unit and functional information showing a desired function to be established in the reconfigurable circuit to a design data generation apparatus; a reception unit operable to receive, from the design data generation apparatus, design data showing a structure of a partial circuit that is necessary to establish the desired function; and a configuration unit operable to cause the reconfigurable circuit to configure the partial circuit on an area including the unconfigured area in the reconfigurable circuit based on the design data received by the reception unit.

Here, the "reconfigurable circuit" and the "configuration unit" above are included in a reconfigurable unit described in the embodiments below. The function of the "generation unit" is carried out by a device information generation unit. The functions of the "transmission unit" and the "reception unit" are carried out by a transmission/reception unit. The "unconfigured area" above indicates an area on which no circuit has been configured in the in the reconfigurable circuit. The "functional information" is equivalent to a functional condition which is included in the device information to be transmitted.

Effects of the Invention

According to this structure, the device of the present invention transmits the circuit information that includes at least area information showing an unconfigured area in the reconfigurable circuit and the functional information. Accordingly, making use of the unconfigured area, the device of the present invention configures the partial circuit based on the received design data, and because of this, it is possible to implement a new function efficiently without losing any of the functions that existed before update.

The device of the present invention, wherein the generation unit may generate the circuit information that includes information showing a function and a structure that are being realized in the reconfigurable circuit. Particularly, the generation unit may generate the circuit information that includes one or more pieces of design data, each showing a structure of a different one of one or more circuits currently configured in the reconfigurable circuit.

According to this structure, the generation unit generates the circuit information that includes one or more design data, each of which showing a structure of a circuit that is configured in the reconfigurable circuit. Accordingly, none of the existing circuits in the reconfigurable circuit overlaps with the partial circuit that is to be configured based on the received design data, and the device can use the reconfigurable circuit efficiently.

Particularly, in the case where each design data is transmitted, the device can effectively reduce the scale of the partial circuit that is to be configured in the reconfigurable circuit, because the device uses all or a part of the existing circuits in the reconfigurable circuit, if such existing circuits can be commonly used for configuration of the partial circuit in order to realize the function indicated by the functional information.

The device of the present invention may further comprise one or more fixed-function logic circuits whose internal structures are not reconfigurable, wherein the generation unit may generate the circuit information that includes one or more pieces of information, each showing a function and a structure that are being realized by a different one of the one or more fixed-function logic circuits.

According to this structure, the generation unit generates the circuit information that includes information showing functions and structures that are being realized by the fixed-function logic circuits in the device. If any of the necessary structures to establish the desired function is equivalent to one of the structures of the existing fixed-function logic circuits, the design data generation apparatus that received the circuit information generates the design data excluding the structure that is equivalent to the structure of the existing fixed-function logic circuit.

The partial circuit configured by the configuration unit based on the above-mentioned design data does not include the structure equivalent to that of the existing fixed-function logic circuit. However, the device of the present invention can establish the desired function by using both of the existing fixed-function logic circuit and the newly configured partial circuit. As a result, with use of the existing fixed-function logic circuit, the device can effectively minimize the scale of the partial circuit that is to be configured in the reconfigurable circuit.

The device of the present invention, wherein the generation unit may generate the circuit information that includes information showing a name of a manufacturer and a product number of the reconfigurable circuit.

Sometimes the internal structure or logic for circuit configuration of a reconfigurable circuit is different depending on a manufacturer or a circuit scale of the reconfigurable circuit.

According to the above structure, the generation unit generates the circuit information that includes the information showing the name of the manufacturer and the product number of the reconfigurable circuit. Receiving the circuit information, the design data generation apparatus can correctly identify the internal structure and the logic for circuit configuration of the reconfigurable circuit from the name of the manufacturer and the product number. Accordingly, the device of the present invention can obtain the design data that has been produced based on the correct logic, without transmitting detailed structural information regarding the reconfigurable circuit.

The device of the present invention, wherein each of the one or more fixed-function logic circuits may include a CPU and a memory that stores therein one or more programs to be executed by the CPU, and the generation unit may generate the circuit information that includes, for each of the one or more fixed-function logic circuits, a piece of information showing a processing capability of the CPU and a remaining capacity of the memory.

The device of the present invention, wherein the generation unit may generate the circuit information that includes, for each of the one or more programs stored in the memory, a piece of program functional information showing a function to be realized by the CPU executing the program.

Sometimes the software programs and the hardware circuits, operate in a coordinated way in order to realize a function. One example is a case in which a highly-confidential operation (such as key generation and encryption processing) is performed by the circuit that has been configured on a tamper-resistant chip, and other operations are performed by the software.

According to the above structure, the generation unit generates the circuit information that includes the information showing the processing capability of the CPU and the remaining capacity of the memory. The device configures the partial circuit based on the design data received via the reception unit. After that, the device can optimally make use of the programs to be executed by the CPU, the fixed-function logic circuits and the circuits in the reconfigurable circuit, taking into consideration the processing capability of the CPU and the remaining capacity of the memory, in order to realize the desired function.

The device of the present invention may further comprise an acceptance unit operable to accept designation by a user of an unnecessary circuit among one or more circuits currently configured in the reconfigurable circuit, wherein the generation unit may generate the circuit information that includes information showing an overwritable area in which the unnecessary circuit designated by the user is configured, and the configuration unit may cause the reconfigurable circuit to configure the partial circuit on an area that includes at least one of the unconfigured area and the overwritable area in the reconfigurable circuit.

The device of the present invention may further comprise a counting unit operable to count the number of uses of each of one or more circuits currently configured in the reconfigurable circuit, wherein the generation unit may generate the circuit information that includes information showing a low use area in which a low use circuit is configured, the low use circuit being a circuit whose number of uses counted is less than a predetermined threshold, and the configuration unit may cause the reconfigurable circuit to configure the partial circuit on an area that includes at least one of the unconfigured area and the low use area in the reconfigurable circuit.

According to this structure, the acceptance unit accepts designation by a user of unnecessary circuit among the circuits existing in the reconfigurable circuit. The generation unit generates the circuit information that includes the information showing the overwritable area.

Also, the counting unit counts the number of uses of each circuit that exists in the reconfigurable circuit. The generation unit generates the circuit information that includes the information showing a low use area on which a circuit whose number of uses counted is less than the predetermined threshold is configured. The low use circuit is considered to be an unnecessary circuit.

Accordingly, based on the design data received via the reception unit, the configuration unit causes the reconfigurable circuit to configure the partial circuit on the area that includes the overwritable area (the low use area). As a result, the device of the present invention can efficiently use the area on which the unnecessary circuits exist.

The device of the present invention may further comprise an acceptance unit operable to accept the functional information inputted by a user, wherein the transmission unit may transmit the functional information inputted.

According to this structure, the acceptance unit accepts the functional information inputted by a user. Because of this, after the configuration unit configures the partial circuit in the apparatus, the device is equipped with the function that is exactly desired by the user.

The device of the present invention, wherein the transmission unit may transmit the functional information showing a decryption algorithm corresponding to an encryption algorithm used for generation of an encrypted confidential data that has been inputted to the device, and a necessary processing capability to decrypt the encrypted confidential data.

According to this structure, the transmission unit transmits, the functional information showing a decryption algorithm corresponding to an encryption algorithm used for generation of an encrypted confidential data, and a necessary processing capability to decrypt the encrypted confidential data. Because of this, after the configuration unit configures the partial circuit in the device of the present invention, the device is equipped with the function for decrypting the encrypted confidential data.

In view of the protection of a copyright, a content or the like is often encrypted, and then distributed. However, if such encryption is broken, the content to be distributed afterward is encrypted by another encryption system that has not been broken yet. In this case, the device to play back the content also needs to be equipped with the function to decrypt such a new encryption system.

Since the device of the present invention has the above-mentioned structure, the device can promptly establish the necessary decryption function, even if the encryption system used for generation of the encrypted content is changed to a new one.

Furthermore, if the existing circuits are left undeleted, the device remains to be equipped with the function to decrypt the encrypted content that had been distributed before the encryption system was broken. Accordingly, it is possible for the device to decrypt both of the encrypted content that was officially purchased before the change of the encryption system and the encrypted content that was newly obtained. As a result, the copyright of the producer of the content can be protected without causing any inconvenience to a user.

The device of the present invention, wherein the encrypted confidential data may include the functional information and an encrypted copyrighted work generated by encrypting a digital copyrighted work, and the transmission unit may transmit the functional information extracted from the encrypted confidential data.

According to this structure, the device of the present invention can easily obtain the functional information by extracting the functional information from the encrypted confidential data.

The device of the present invention, wherein the transmission unit may transmit the functional information showing a necessary function to obtain data recorded in a recording medium attached to the device, depending on a type of the recording medium.

According to this structure, the transmission unit transmits the functional information showing the necessary function to obtain data recorded in a recording medium depending on a type of the recording medium attached to the device.

There are a variety of types of the recording media, such as a DVD, a memory card and a Blu-ray Disc, and each recording medium complies with a different specification. Therefore, in order to obtain data recorded in one of such recording media, the device needs to perform operations, such as an device authentication, a signature verification and a key generation, that conform to the specification with which the target recording medium complies.

Since the device of the present invention has the above structure, it is possible to establish the necessary function to obtain data from the recording medium attached to the device, even if any kind of the recording media is attached.

The device of the present invention may further comprise: an identification unit operable to identify the type of the recording medium attached to the device; a storage unit operable to store therein a functional information table that associates one or more pieces of medium functional information one-to-one with one or more types of recording media that have a possibility to be attached to the device, each piece of the medium functional information showing a function necessary to obtain data recorded in a recording medium of one of the types of the recording media that is associated therewith; and a read unit operable to read, from the functional information table, a piece of the medium functional information according to the type of the recording medium attached to the device, wherein the transmission unit may transmit the read piece of the medium functional information as the functional information.

According to the above structure, the storage unit stores therein the functional information table, and the read unit reads out the medium functional information that corresponds to the recording medium identified by the identification unit. Because of this, the transmission unit can promptly obtain the functional information by a simple operation of the read unit, which is to read out the functional information.

The device of the present invention, wherein the transmission unit may transmit the functional information showing a type of data inputted to the device.

According to the above structure, the device can establish the necessary function to use the data inputted, even if any kind of data is inputted to the device.

The device of the present invention that may be capable of communicating with one or more external apparatuses via a network, wherein the transmission unit may transmit the functional information showing one or more functions necessary to use data stored in one or more external apparatuses with which the device is going to communicate.

According to this structure, the transmission unit transmits the functional information showing the necessary function to use the data stored in one or more external apparatuses with which the device is going to communicate. As a result, after the partial circuit is configured in the device, the device is equipped with the necessary function to use the data stored in the one or more external apparatuses.

Each of the external apparatuses might comply with a different apparatus authentication system, or each might have the data encrypted by a different encryption system. Because of the above structure, the device of the present invention can establish the necessary function to communicate with, and to obtain the data from, the one or more external apparatuses, depending on the external apparatuses with which the apparatus is going to communicate.

The device of the present invention may further comprise: a storage unit operable to store therein a functional information table that associates one or more pieces of apparatus functional information one-to-one with one or more external apparatuses with which the device has a possibility to communicate, each piece of the apparatus functional information showing a function necessary to use data stored in one of the one or more external apparatuses that is associated therewith; and a read unit operable to read, from the functional information table, at least one of the one or more pieces of the apparatus functional information according to the one or more external apparatuses with which the device is going to communicate, wherein the transmission unit may transmit the read at least one of the one or more pieces of the apparatus functional information as the functional information.

According to the above structure, the storage unit stores therein the functional information table, and the read unit reads out at least one of the one or more pieces of medium functional information according to the one or more external devices with which the apparatus is going to communicate. Because of this, the transmission unit can promptly obtain the functional information by a simple operation of the read unit, which is to read out the functional information.

The device of the present invention may further comprise: an acquisition unit operable to acquire data from outside, a judgment unit operable to judge whether a function necessary to use the data acquired from outside is being realized by the one or more fixed-function logic circuits and one or more circuits currently configured in the reconfigurable circuit; and a control unit operable, only when the judgment unit judged negatively, to instruct the generation unit to generate the circuit information, and instruct the transmission unit to transmit the generated circuit information and the functional information showing the function necessary to use the data.

According to this structure, if the judgment unit judges that the function necessary to use the data is not being realized by the fixed-function logic circuits and the circuits existing in the reconfigurable circuit, the control unit instructs to the generation unit to generate the circuit information, and instructs to the transmission unit to transmit the circuit information and the functional information showing the function necessary to use the data. Since the device itself judges whether the update of the function thereof is necessary or not, it is possible to correctly establish the necessary function. Furthermore, if update is unnecessary, the device can avoid unnecessary communication.

The device of the present invention, wherein the reception unit may receive the design data written in a high-level language from the design data generation apparatus, and the configuration unit may include: a conversion sub-unit operable to convert the design data written in the high-level language to the design data written in a machine language; and a configuration sub-unit operable to cause the reconfigurable circuit to configure the partial circuit therein according to the design data written in the machine language.

According to this structure, the conversion sub-unit converts the design data written in the high-level language to the design data written in the machine language, and the configuration sub-unit causes the reconfigurable circuit to configure the partial circuit based on the design data written in the machine language.

Accordingly, if the design data generation apparatus is flooded with the numerous requests of update from many devices, for example, in a case where a critical defect relating to the security was found, the design data generation apparatus does not need to perform compilation but only needs to distribute the design data for establishing the function to repair the defect. Therefore, it is possible to reduce the load on the design data generation apparatus.

BRIEF DESCRIPTION OF THE DRAWINGS

FIG. 4 shows an example of a design data list 210 stored in a design data storage unit 203;

FIG. 5 shows an example of a fixed-function logic circuit list 310 stored in a fixed-function logic circuit information storage unit 204;

FIG. 9 is an example of information showing necessary functions to playing back an encrypted content;

Figure 1:
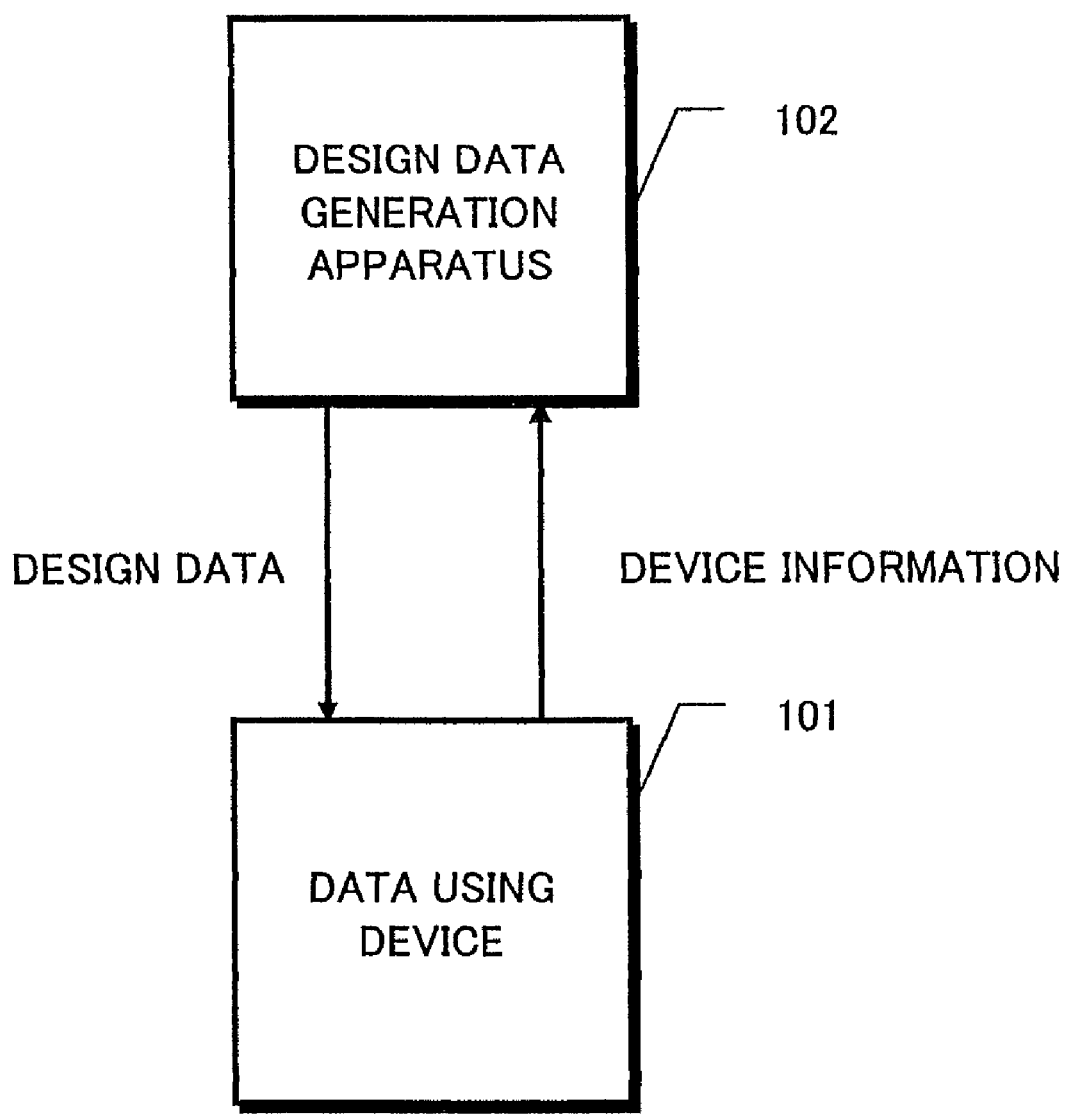
FIG. 1 shows an overall structure of a design data generation apparatus and a data using device pertaining to the present invention.

DESCRIPTION OF REFERENCE NUMERALS 101, 800 data using device
102 design data generation apparatus
201 reconfigurable unit
202 fixed-function logic circuit
203 design data storage unit
204 fixed-function logic circuit information storage unit
205, 802 device information generation unit
206, 301 transmission/reception unit
220 reconfigurable circuit
221 logic block LB1
231 switch matrix S1
251-253 LUT
254, 255 flip flop
261 transistor switch group
280 design data A
302 design data generation unit
401 reconfigurable circuit information
402 area management table
801 functional information extraction unit

DETAILED DESCRIPTION OF THE INVENTION

1. Embodiment 1

The embodiment 1 of the present invention is described below with reference to the drawings.
1.1 Structure of Update System 1
As FIG. 1 shows, an update system 1 includes a data using device 101 and a design data generation apparatus 102. The data using device 101 is equivalent to various audio-video devices for home use such as a DVD player, a video game player and a personal computer, and various computer-controlled devices such as a microwave oven, an air conditioner, a car and a robot. In the following descriptions, however, the device is simply referred to as the "data using device".

The data using device 101 transmits device information such as information about circuits included in the data using device 101, to the design data generation apparatus 102. The data using device 101 then receives design data generated by the design data generation apparatus 102, and updates a function of the data using device based on the received design data.

The design data generation apparatus 102 receives device information from the data using device 101. Then the design data generation apparatus 102 generates design data based on the received device information, and transmits the generated design data to the data using device 101.

Here, the data on the communication channel is protected by, for example, the DES (Data Encryption Standard) or the like. Since the DES is a well-known technology, a description thereof is omitted.

1.2 Structure of the Data Using Device 101

Figure 2:
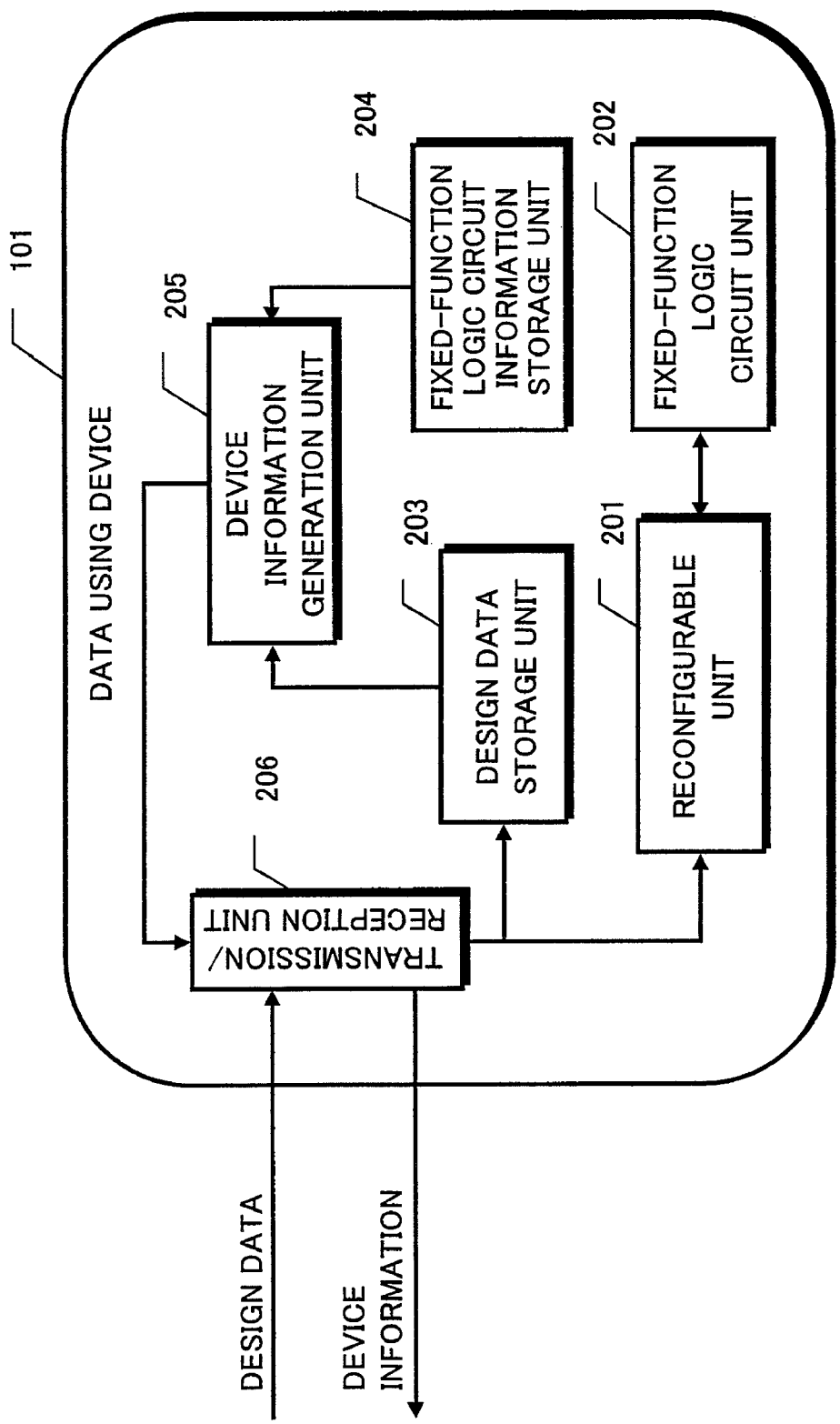
FIG. 2 is a block diagram showing functions of a data using device 101 in the embodiments of the present invention.

As FIG. 2 shows, the data using device 101 includes a reconfigurable unit 201, a fixed-function logic circuit 202, a design data storage unit 203, a fixed-function logic circuit information storage unit 204, a device information generation unit 205, and a transmission/reception unit 206. Although FIG. 2 shows only the functional blocks that are relevant to the characteristics of the present invention, the data using device 101 also includes other blocks needed to achieve the functions thereof. For example, if the data using device is a video game player, the data using device includes an input unit that receives an operation of a user, a display, a drive unit to read out game software from a storage medium, a main control unit that controls an operation of each functional unit, and so on.

The data using device 101 is structured from a microprocessor, a RAM, a ROM, a hard disk unit, or the like that are not illustrated specifically. Each of the RAM, the ROM and the hard disk unit stores therein a computer program. The data using device 101 achieves a part of its function by the microprocessor operating in accordance with the computer program.

Figure 12:
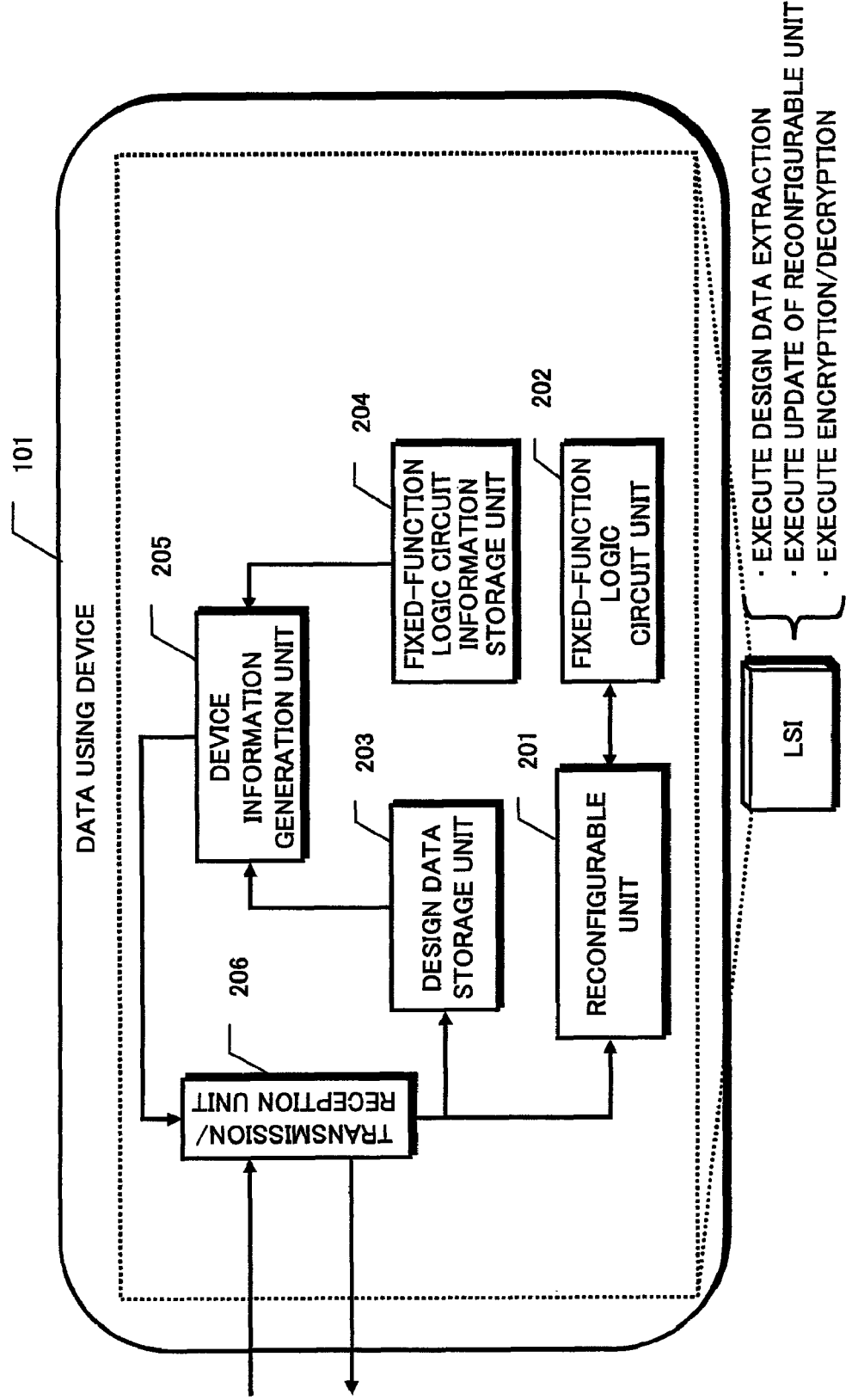
FIG. 12 is an example of an integrated circuit that realizes the data using device 101 in the embodiments of the present invention.

The functional blocks such as the reconfigurable unit 201, the fixed-function logic circuit 202, the design data storage unit 203, the fixed-function logic circuit information storage unit 204, the device information generation unit 205, and the transmission/reception unit 206 are typically realized as an LSI that is an integrated circuit. These functional blocks may be separately realized on individual chips, or all of these functional blocks may be included in a single chip. An example is shown in FIG. 12.

The LSI here may be referred to as an IC, a system LSI, a super LSI, or an ultra LSI depending on the degree of integration.

The LSI is not the only way to realize the integration of circuits, and a special-purpose circuit or a general-use processor may also be used. It is also possible to use a FPGA (Field Programmable Gate Array) that is programmable after manufacturing of LSI, or a reconfigurable processor that enables reconfiguration of the connection and settings of circuit cells in the LSI.

Furthermore, instead of the LSI, if any alternative technology of realizing integrated circuit appears due to advancement of semiconductor technology or derivative technology, obviously such technology may also be applied to realize the integration of the functional blocks. Application of biotechnology is one possibility.

(1) Reconfigurable Unit 201

The reconfigurable unit 201 configures hardware circuits based on the design data that the transmission/reception unit 206 received.

(2) Fixed-Function Logic Circuit 202

The fixed-function logic circuit 202 includes fixed-function logic circuits that cannot be reconfigured, such as a cryptography circuit and a computing circuit.

(3) Design Data Storage Unit 203

The design data storage unit 203 stores therein pieces of design data in a list form. The design data is the data received by the transmission/reception unit 206. An example of such a list is shown in FIG. 4. FIG. 4 shows a design data list 210 that includes three pieces of design data (design data A, B and C) by which three kinds of the circuits are being realized in the reconfigurable unit 201.

The design data list 210 is composed of identifiers and pieces of design data, associated with each other. Each identifier represents a circuit currently configured in the reconfigurable unit 201, and the corresponding design data is the data for configuring the circuit.

In a case where the transmission/reception unit 206 receives a new piece of design data, the design data list 210 is to be updated so as to include the received design data. On the contrary in a case where a circuit in the reconfigurable unit 201 is deleted due to an operation by a user or update of the reconfigurable unit 201, the corresponding piece of the design data is to be deleted from the design data list 201. The update of the reconfigurable unit 210 is to be discussed below.

(4) Fixed-Function Logic Circuit Information Storage Unit 204

The fixed-function logic circuit information storage unit 204 stores therein information of the fixed-function logic circuit 202, which is the circuit that cannot be reconfigured and is included in the data using device 101. The circuits included in the fixed-function logic circuit 202 are, for example, a cryptography circuit and a computing circuit. The fixed-function logic circuit information is, for example, a name or an identification number of a function provided by each fixed-function logic circuit, and is produced in such a format that both of the design data generation apparatus and the data using device can identify the function of each circuit. Hereinafter such information is collectively referred to as the "fixed-function logic circuit information". The fixed-function logic circuit information storage unit 204 stores therein the above-mentioned fixed-function logic circuit information in a list form. An example is shown in FIG. 5. FIG. 5 shows a fixed-function logic circuit list 310 stored in the fixed-function logic circuit information storage unit 204. The fixed-function logic circuit list 310 is composed of the names of three fixed-function logic circuits, AES (Advanced Encryption Standard) circuit, the 32 bit multiplier and the 64 bit accumulator, included in the data using device 101. The fixed-function logic circuit list 310 shows information of the fixed-function logic circuits that were implemented before the shipment of the data using device 101, and basically this information is not to be updated.

(5) Device Information Generation Unit 205

When the circuits in the reconfigurable unit 201 are to be updated, the device information generation unit 205 reads out the lists that the design data storage unit 203 and the fixed-function logic circuit information storage unit 204 store respectively. The device information generation unit 205 also acquires functional information that shows, for example, a desired function inputted by a user or a necessary function for the data using device to use particular data.

The device information generation unit 205 integrates the read lists and the functional information, and generates device information. The generated device information is transmitted to the design data generation apparatus 102 via the transmission/reception unit 206.

(6) Transmission/Reception Unit 206

The transmission/reception unit 206 is connected to outside via, for example, the Internet. Specifically, the transmission/reception unit 206 is connected to the design data generation apparatus 102.

The transmission/reception unit 206 transmits the device information generated by the device information generation unit 205 to the design data generation apparatus 102. Also, the transmission/reception unit 206 receives the design data generated by the design data generation apparatus 102, and outputs the received design data to the design data storage unit 203 and to the reconfigurable unit 201.

1.3 Structure of design Data Generation Apparatus 102

Figure 3:
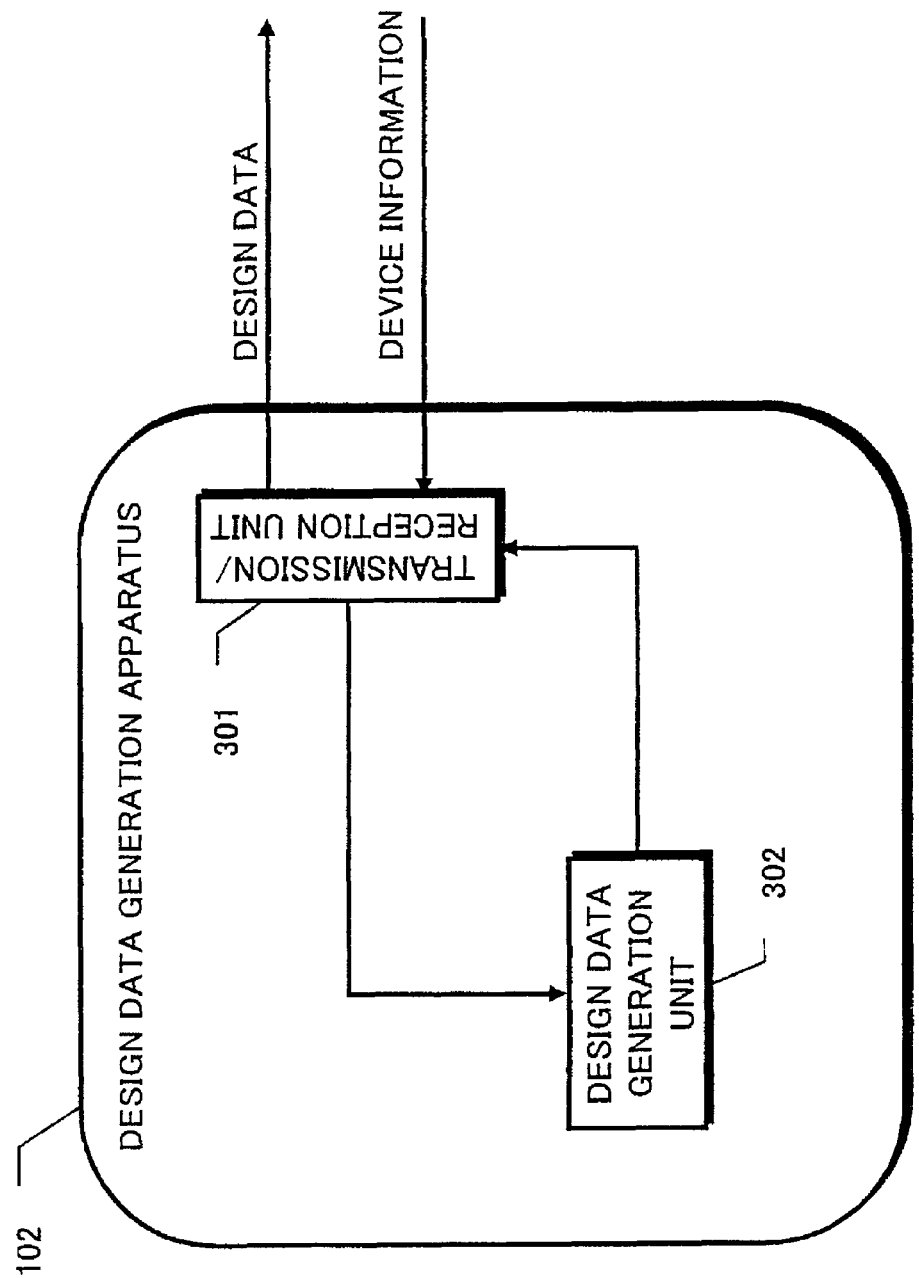
FIG. 3 is a block diagram showing functions of a design data generation apparatus 102 in the embodiments of the present invention.

As shown in FIG. 3, the design data generation apparatus 102 includes a transmission/reception unit 301 and a design data generation unit 302.

The design data generation apparatus 102 includes a microprocessor, a RAM, a ROM, a hard disk unit, or the like that are not illustrated specifically. The RAM, ROM and the hard disk unit store therein a computer program. The design data generation apparatus 102 achieves a part of its function by the microprocessor operating in accordance with the computer program.

The functional blocks, such as the transmission/reception unit 301 and the design data generation unit 302, are typically realized as an LSI that is an integrated circuit. These functional blocks may be separately realized on individual chips, or all of these functional blocks may be included in a single chip.

The LSI here may be referred to as an IC, a system LSI, a super LSI, or an ultra LSI depending on the degree of integration.

The LSI is not the only way to realize the integration of circuits, and a special-purpose circuit or a general-use processor may also be used. It is also possible to use a FPGA (Field Programmable Gate Array) that is programmable after manufacturing of LSI, or a reconfigurable processor that enables re-configuration of the connection and settings of circuit cells in the LSI. Furthermore, instead of the LSI, if any alternative technology of realizing integrated circuit appears due to advancement of semiconductor technology or derivative technology, obviously such technology may also be applied to realize the integration of the functional blocks. Application of biotechnology is one possibility.

(1) Transmission/Reception Unit 301

The transmission/reception unit 301 is connected to outside via, for example, the Internet. Specifically, the transmission/reception unit 301 is connected to the data using device 101.

The transmission/reception unit 301 receives the device information from the data using device 101, and outputs the received device information to the design data generation unit 302. The transmission/reception unit 301 also transmits the design data generated by the design data generation unit 302 to the data using device 101.

(2) Design Data Generation Unit 302

The design data generation unit 302 generates design data based on the device information received by the transmission/reception unit 301. To be more precise, the design data generation unit 302 generates the design data for realizing the desired function with use of an unconfigured area in the reconfigurable unit 201 without updating other hardware circuits in the reconfigurable unit 201, or for efficiently realizing the desired function with use of the existing circuits in the fixed-function logic circuit 202.

As described above, the received device information includes the design data of each circuit currently configured in the reconfigurable unit 201, the fixed-function logic circuit list and the functional information.

Generation of the design data for realizing the desired function is described below in orderly sequence.

The design data generation unit 302 analyzes the received device information. Based on the functional information, the design data generation unit 302 identifies a function desired by the data using device 101. Subsequently, based on the fixed-function logic circuit list and the design data of each circuit currently configured in the reconfigurable unit 201, the design data generation unit 302 identifies the functions of the existing circuits in the data using device 101 and an unconfigured area in the reconfigurable unit 201.

Here, the design data generation unit 302 may be informed in advance of the scales or the forms of the circuits in the reconfigurable unit 201 in the data using device 101, or such information may be included in the device information.

In order to configure the function indicated by the functional information, the design data generation unit 302 identifies whether there are any existing circuits that are usable for realizing of the desired function. If there are, the design data generation unit 302 generates the design data for configuring a circuit that includes the usable circuits while adding other circuits to make up for a missing function.

Alternatively, the design data generation unit 302 may perform more detailed analysis of the received design data. If a necessary structure to realize the function indicated by the received functional information is included in any of the circuits currently configured in the reconfigurable unit 201, the design data generation unit 302 may generate design data that includes the wirings of the necessary structure in the reconfigurable unit 201 such that the necessary structure in the reconfigurable unit 201 can be commonly used for a newly configured circuit.

Subsequently, the design data generation unit 302 transmits the generated design data to the data using device 101 via the transmission/reception unit 301.

1.4 Operations of Data Using Device 101 and Design Data Generation Apparatus 102

Figure 6:
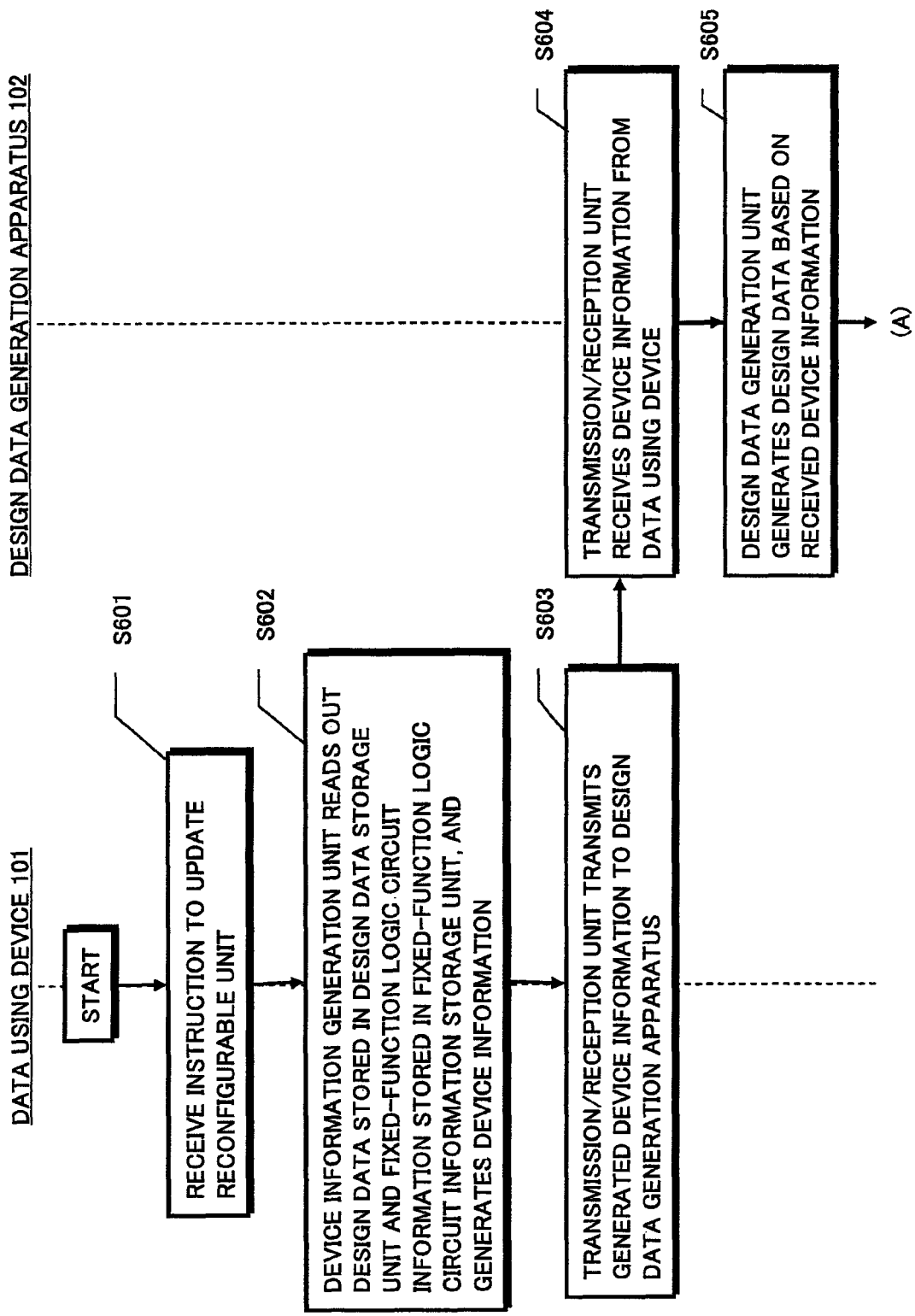
FIG. 6 is a flow chart showing operations of the data using device 101 and the design data generation apparatus 102 in the embodiments of the present invention.
Figure 7:
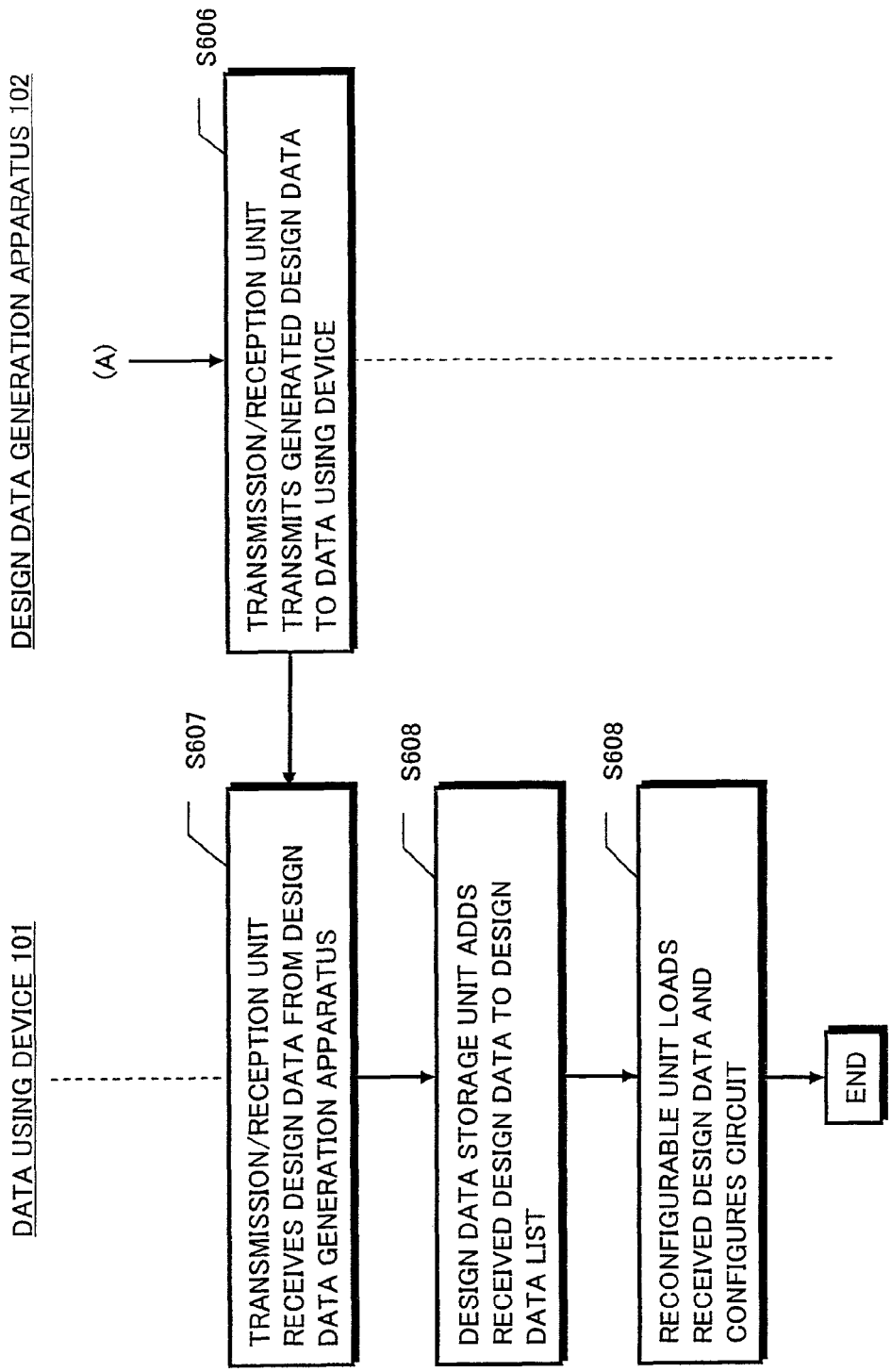
FIG. 7 is a flow chart showing operations of the data using device 101 and the design data generation apparatus 102 in the embodiments of the present invention.

The operations of the data using device 101 and the design data generation apparatus 102 are described below with reference to FIG. 6 and FIG. 7.

The data using device 101 receives an instruction to update the reconfigurable unit 201 (step S601). Then the device information generation unit 205 reads out the design data stored in the design data storage unit 203 and the fixed-function logic circuit information stored in the fixed-function logic circuit information storage unit 204, and generates the device information (step S602). The transmission/reception unit 206 then transmits the generated device information to the design data generation apparatus 102 (step S603).

The transmission/reception unit 301 of the design data generation apparatus 102 receives the device information transmitted by the transmission/reception unit 206 of the data using device (step S604). Based on the device information received in the step S604, the design data generation unit 302 generates the design data to configure the desired function (step S605). The transmission/reception unit 301 then transmits the design data generated in the step S605 to the data using device 101 (step S606).

The transmission/reception unit 206 of the data using device 101 receives the design data generated in the step S605 (step S607), and outputs the received design data to the design data storage unit 203 and to the reconfigurable unit 201. The design data storage unit 203 adds the received design data to the design data list 210 (step S608). The reconfigurable unit 201 loads the received design data and realizes the desired hardware circuit (step S609).

2. Embodiment 2

The embodiment 2 of the present invention is described below. As shown in the embodiment 1, the embodiment 2 also includes a data using device and a design data generation apparatus. The structure of the design data generation apparatus of the embodiment 2 is the same as that of the embodiment 1, hence its description is omitted. The description here is mainly about the data using device that is the characteristic of the embodiment 2.

2.1 Structure of the Data Using Device 800

Figure 8:
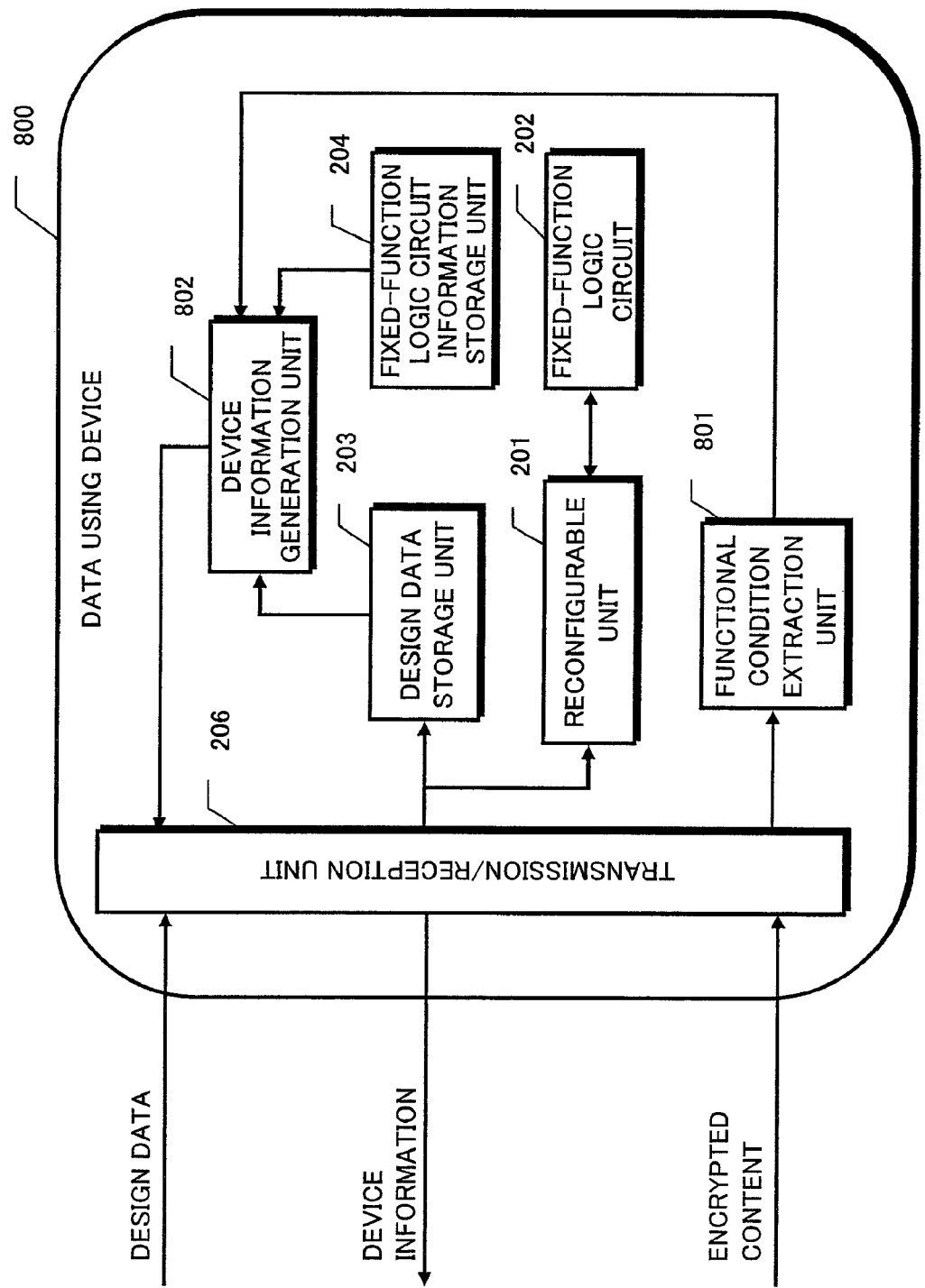
FIG. 8 is a block diagram showing functions of a data using device 800 in the embodiments of the present invention.

As shown in FIG. 8, the data using device 800 includes a reconfigurable unit 201, a fixed-function logic circuit 202, a design data storage unit 203, a fixed-function logic circuit information storage unit 204, a transmission/reception unit 206, a functional condition extraction unit 801, and a device information generation unit 802.

The data using device 800 is structured from a microprocessor, a RAM, a ROM, a hard disk unit, or the like that are not illustrated specifically. Each of the RAM, ROM and the hard disk unit stores therein a computer program. The data using device 800 achieves a part of its function by the microprocessor operating in accordance with the computer program.

The functional blocks such as the reconfigurable unit 201, the fixed-function logic circuit 202, the design data storage unit 203, the fixed-function logic circuit information storage unit 204, the transmission/reception unit 206, the functional condition extraction unit 801, and the device information generation unit 802 are typically realized as an LSI that is an integrated circuit. These functional blocks may be separately realized on individual chips, or all of these functional blocks may be included in a single chip.

The LSI here may be referred to as an IC, a system LSI, a super LSI, or an ultra LSI depending on the degree of integration.

The LSI is not the only way to realize the integration of circuits, and a special-purpose circuit or a general-use processor may also be used. It is also possible to use a FPGA (Field Programmable Gate Array) that is programmable after manufacturing of LSI, or a reconfigurable processor that enables re-configuration of the connection and settings of circuit cells in the LSI.

Furthermore, instead of the LSI, if any alternative technology of realizing integrated circuit appears due to advancement of semiconductor technology or derivative technology, obviously such technology may also be applied to realize the integration of the functional blocks. Application of biotechnology is one possibility.

The reconfigurable unit 201, the fixed-function logic circuit 202, the design data storage unit 203, fixed-function logic circuit information storage unit 204 and the transmission/reception unit 206 have the same structure as those in the data using device 101, hence their descriptions are omitted.

(1) Functional Condition Extraction Unit 801

The functional condition extraction unit 801 receives an encrypted content from the transmission/reception unit 206, and extracts conditions relating to a necessary function to decrypt the encrypted content (hereinafter such conditions are referred to as "functional conditions") from the received encrypted content. One example of the functional conditions is shown in FIG. 9. The functional conditions are assumed to be sent together with the encrypted content. FIG. 9 shows that the encrypted content A is encrypted by the AES, and the necessary processing capability to decrypt the AES is 24 Mbps (24 Mega bit/second). The functional condition extraction unit 801 outputs the extracted functional conditions to the device information generation unit 802.

(2) Device Information Generation Unit 802

When the reconfigurable unit 201 is to be updated, the device information generation unit 802 reads out the lists stored in the design data storage unit 203 and the fixed-function logic circuit information storage unit 204. The device information generation unit 802 also obtains the functional conditions from the functional condition extraction unit 801, and integrates the obtained functional conditions with the read out lists to generate the device information. The generated device information is transmitted to the design data generation apparatus 102 via the transmission/reception unit 206.

2.2 Operations of the Data Using Device 800 and the Design Data Generation Apparatus 102

Figure 10:
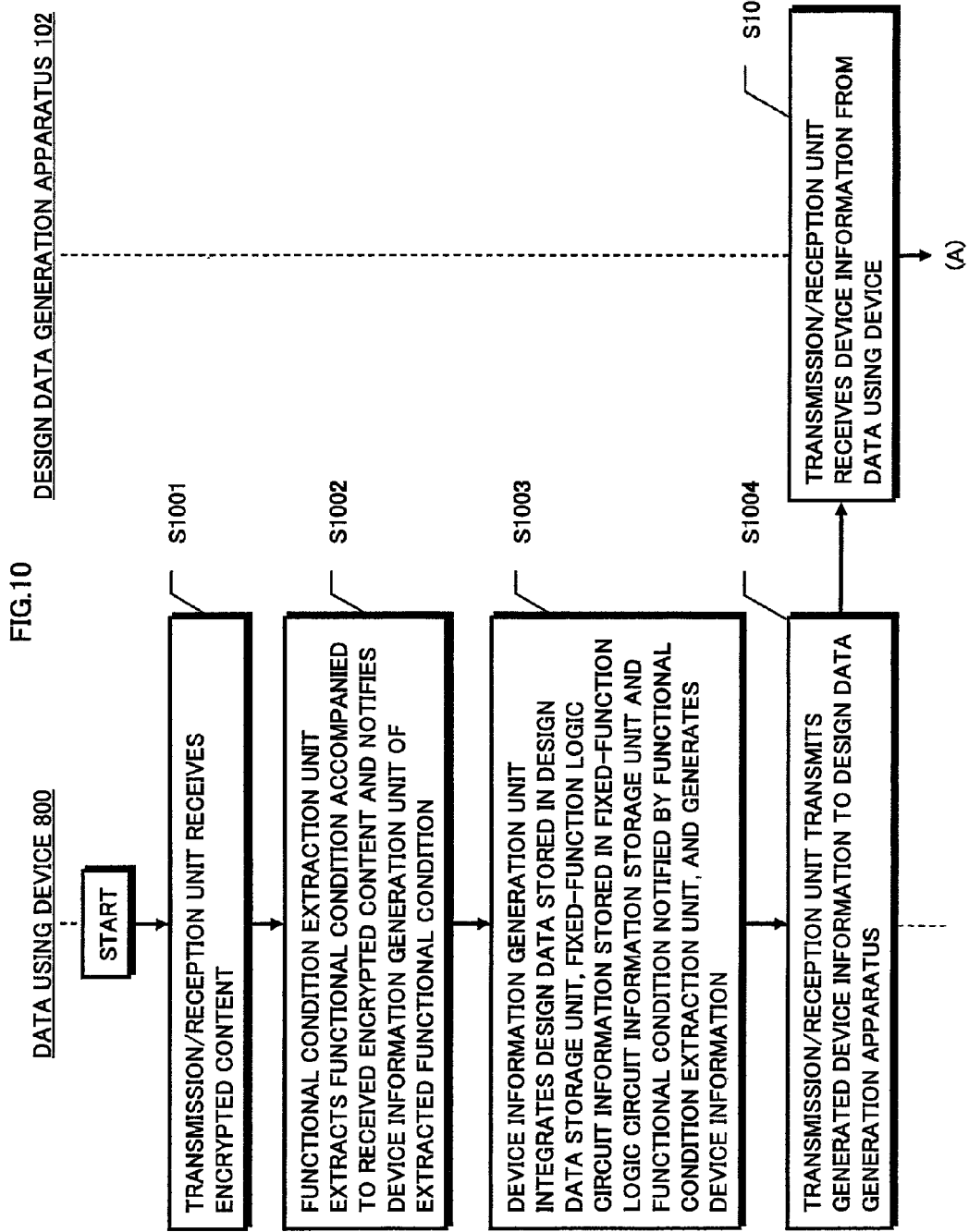
FIG. 10 is a flow chart showing operations of the data using device 800 and the design data generation apparatus 102.
Figure 11:
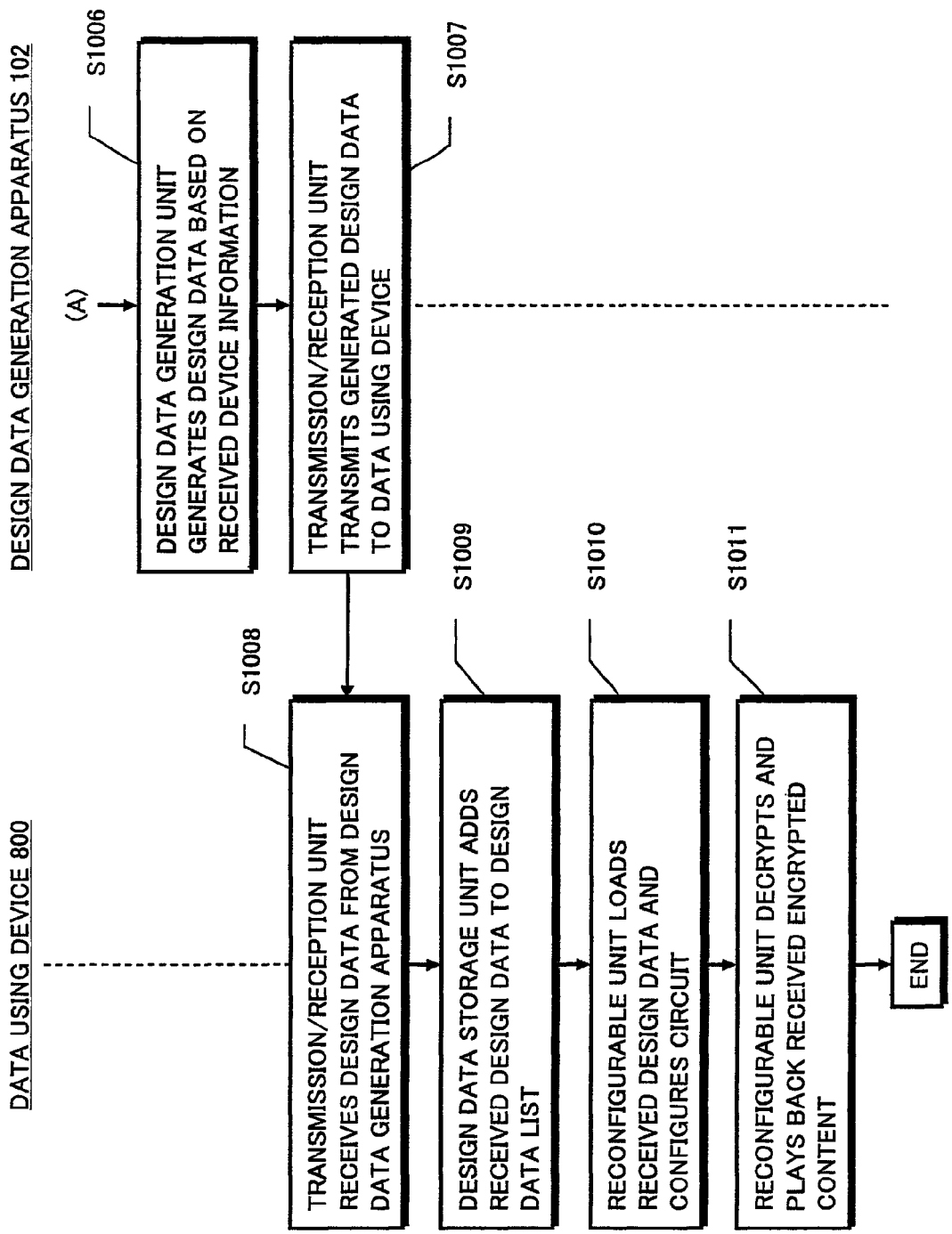
FIG. 11 is a flow chart showing operations of the data using device 800 and the design data generation apparatus 102.

The operations of the data using device 800 and the design data generation apparatus 102 are described with reference to FIG. 10 and FIG. 11.

The transmission/reception unit 206 of the data using device 800 receives the encrypted content (step S1001). Then the functional condition extraction unit 801 extracts the necessary functional conditions for decrypting the encrypted content from the encrypted content received in the step S1001, and notify the device information generation unit 802 of the extracted functional conditions (step S1002). The device information generation unit 802 then reads out the design data stored in the design data storage unit 203 and the fixed-function logic circuit information stored in the fixed-function logic circuit information storage unit 204. In addition, the device information generation unit 802 integrates the functional conditions necessary to decrypt the encrypted content, which is notified in the step S1002, with the read out information, and generates the device information (step S1003). The transmission/reception unit 206 transmits the generated device information to the design data generation apparatus 102 (step S1004).

The transmission/reception unit 301 of the design data generation apparatus 102 receives the device information that the transmission/reception unit 206 of the data using device 800 transmitted (step S1005). Based on the device information received in the step S1005, the design data generation unit 302 generates the desired design data (step S1006). The transmission/reception unit 301 then transmits the design data generated in the step S1006 to the data using device 800 (step S1007).

The transmission/reception unit 206 of the data using device 800 receives the design data generated in the step S1006 (step S1008), and outputs the received design data to the design data storage unit 203 and to the reconfigurable unit 201. The design data storage unit 203 adds the received design data to the design data list 210 (step S1009), and the reconfigurable unit 201 loads the received design data and configures the desired hardware circuit (step S1010). Lastly, the reconfigurable unit 201 decrypts the previously received encrypted content with use of the circuit that has been configured in the step S1010, and outputs the decrypted content. Then a playback processing unit, not illustrated, plays back the content (step S1011).

3. Details of the Reconfigurable Unit

Up to now, the embodiment 1 and 2 have been described, and for easier understanding of the above embodiments, the reconfigurable unit 201 is described in detail below.

3.1 Structure of the Reconfigurable Unit

Specifically, the reconfigurable unit 201 is structured so as to include a reconfigurable circuit. As to the reconfigurable circuit, there are a variety of types of the reconfigurable circuits available, such as reconfigurable LSI, PLD, CPLD, PLA and FPGA, depending on a circuit scale or logic for circuit configuration. Also, a name or logic for circuit configuration may differ depending on manufactures.

As an example here, FPGA (Field Programmable Array) of LUT (Look Up Table) type is used in the description below.

Figure 13:
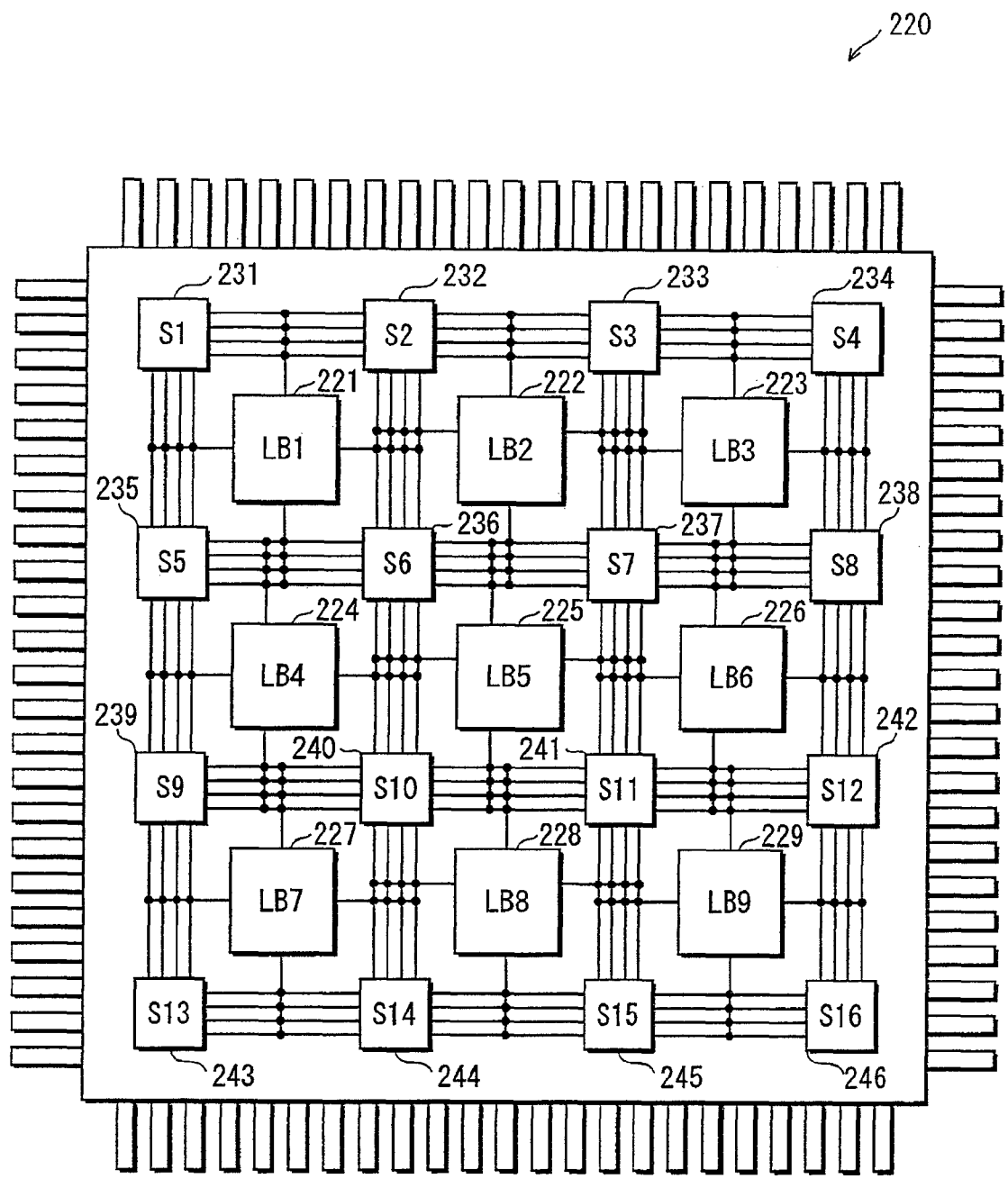
FIG. 13 is an example showing the structure of a reconfigurable circuit 220 that constitutes a reconfigurable unit 201.

FIG. 13 is a diagrammatic illustration that shows the inner structure of a reconfigurable circuit 220.

The reconfigurable circuit 220 is composed of a logic block LB1 (221), a logic block LB2 (222), a logic block LB3 (223), a logic block LB4 (224), a logic block LB5 (225), a logic block LB6 (226), a logic block LB7 (227), a logic block LB8 (228), a logic block LB9 (229), sixteen switch matrices 231 to 246, and wiring connecting the logic blocks and the switch matrices. Note that LB1 to LB9 are the identification names, each of which identifies a logic block. LB1, LB2 and LB3 are the identification names assigned to three logic blocks in the first row starting from the left, LB4, LB5 and LB6 are the identification names assigned to three logic blocks in the second row starting from the left, and LB7, LB8 and LB9 are the identification names assigned to three logic blocks in the third row starting from the left. S1 to S16 are also the identification names, each of which identifies a switch matrix. In the same way as the logic blocks, these identification names are assigned to the switch matrices starting from the left in the first row to the right in the third row. Here, each element is identified by an identification name, but is not limited to be identified by this. The elements may be identified by any information that can identify a location and a type of an element, such as a pre-assigned address information or identifier of each logic block or switch matrix.

As shown in FIG. 13, the logic block LB1 (221) to LB9 (229) are arranged in a matrix pattern of a three by three array. Sixteen switch matrices S1 (231) to S16 (246) a rearranged at the intersections of wiring that connects the logic blocks.

Figure 14:
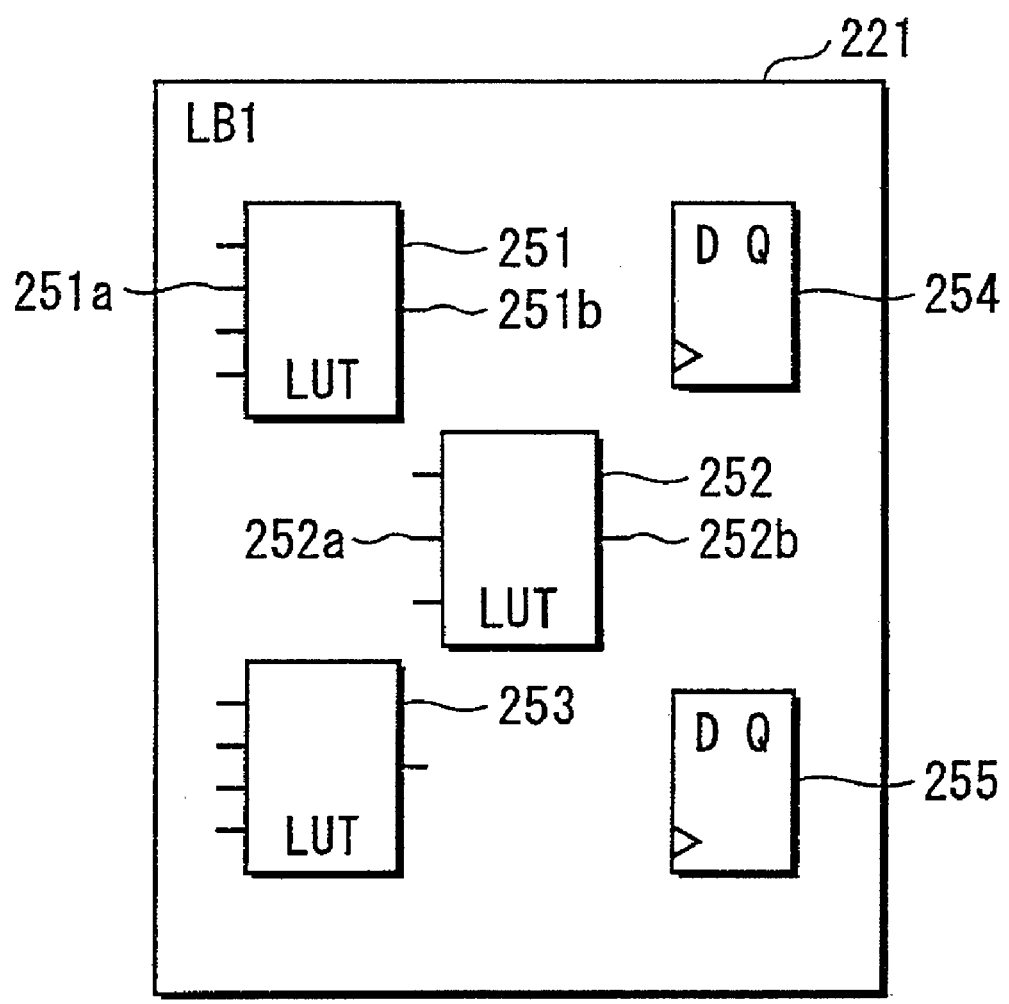
FIG. 14 shows an internal structure of a logic block LB1 (221)

FIG. 14 shows the internal structure of the logic block LB1 (221). Note that the logic blocks LB2 (222) to LB9 (229) have an identical structure to the logic block LB1 (221).

The logic block LB1 (221) is composed of a LUT 251, a LUT 252, a LUT 253, a flip flop 254 and a flip flop 255. The LUT 251 and the LUT 253 have a 4-input/1-output structure, and the LUT 252 has a 3-input/1-output structure. However, since this is an example, the present invention is not limited to this structure. Specifically, each LUT is structured by a small-scale SRAM.

Figure 15:
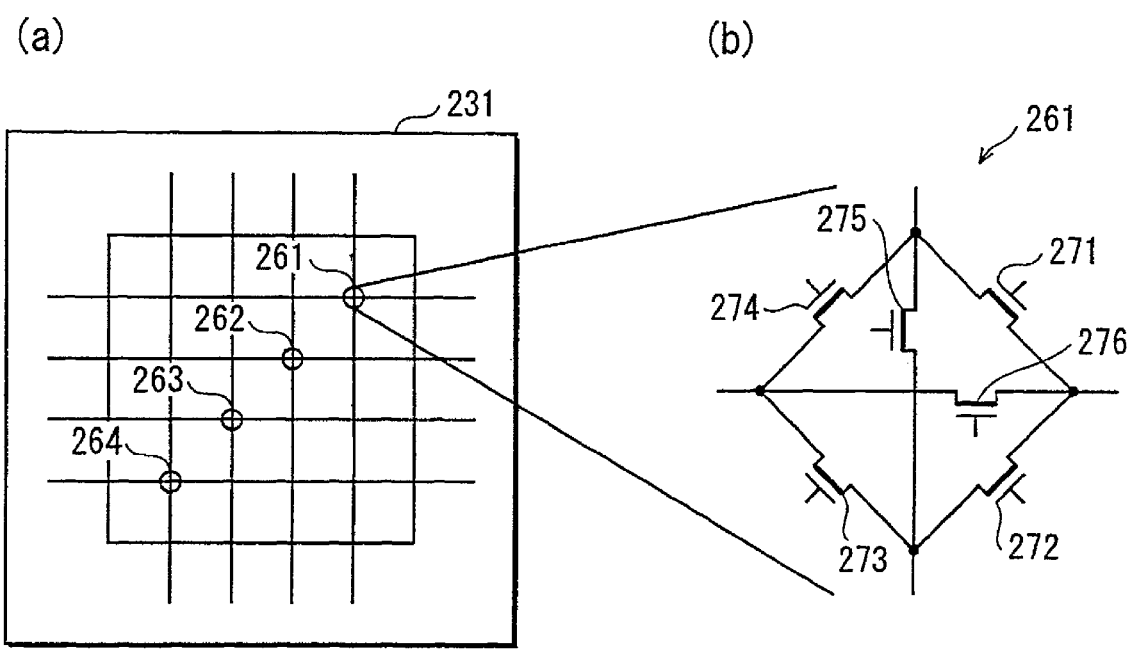
FIGS. 15A and 15B show the structures of a switch matrix S1 (231) and a transistor switch group 261.

FIGS. 15A and 15B shows the structure of the switch matrix S1 (231). Note that switch matrices S2 (232) to S16 (246) have an identical structure to the switch matrix S1 (231).

The switch matrix S1 (231) is composed of transistor switch groups 261, 262, 263 and 264 that are placed at intersections between vertical wiring channel and horizontal wiring channel that constitute the wiring.

FIG. 15B shows the structure of the transistor switch group 261. Note that the transistor switch groups 262 to 264 have an identical structure to the transistor switch group 261.

The transistor switch group 261 is composed of six transistor switches 271 to 276. Each transistor switch is set to ON or OFF with use of SRAM, and by this setting the logic blocks are either connected or disconnected.

3.2 Design Data

In the embodiments above, the design data stored in the design data storage unit 203 or the design data generated by the design data generation apparatus 102 includes a bit string that shows the logic blocks and the switch matrices to be used for the circuit identified by the identifier, the LUT setting values that constitute each of the aforementioned logic blocks, and the ON/OFF settings of the transistor switches included in each of the aforementioned switch matrices.

Figure 16:
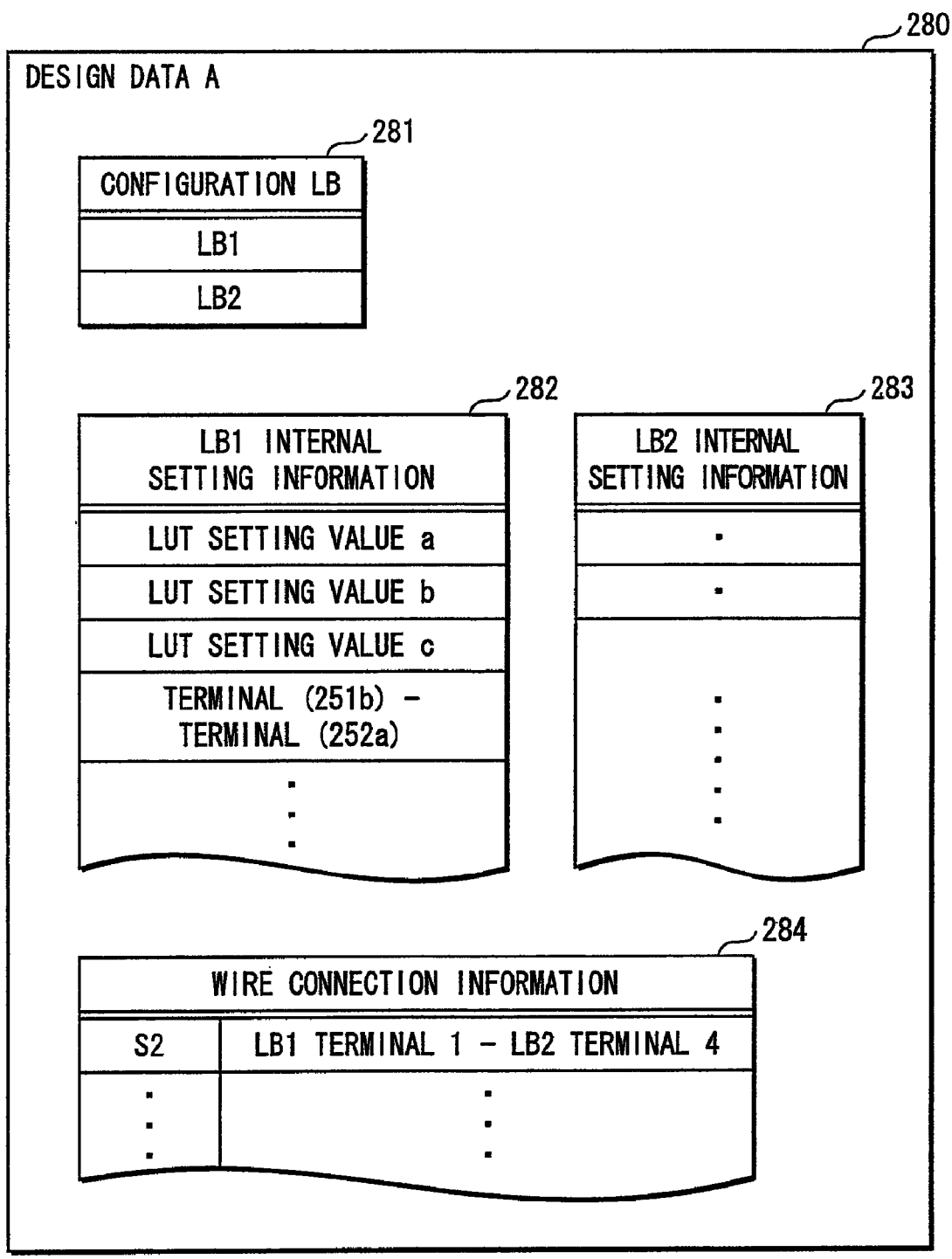
FIG. 16 shows information included in design data A 280 in the table format.

As an example, FIG. 16 shows an overview of the design data A stored in the design data list 210. Although the actual data is written in the machine language readable for the reconfigurable unit 201, here the data is shown in the table format for easier understanding. As a matter of convenience, a circuit that is configured by the design data A is referred to as the circuit A.

As shown in FIG. 16, the design data A is composed of a configuration LB table 281, an LB1 internal setting information table 282, an LB2 internal setting information table 283, and a wire connection information table 284.

The configuration LB table 281 shows the logic blocks that configure the circuit A. The configuration LB table 281 as an example indicates that the circuit A is configured by the logic block LB1 (221) and the logic block LB2 (222).

The LB1 internal setting information table 282 is composed of information about the internal settings of the logic block LB1 (221). The internal setting information shows the LUT setting values and connection inside of the logic block LB1 (221). For example, the LB1 internal setting information table 282 here shows that LUT 251, LUT 252 and LUT 253 store the LUT setting values of a, b and c, respectively, and a terminal 251b of the LUT 251 is connected to a terminal 252a of the LUT 252.

The LB2 internal setting information table 283 has an identical structure to the LB1 internal setting information table 282, and is composed of the information about the settings inside of the logic block LB2 (222).

The wire connection information table 284 is composed of one or more pieces of wire connection information relating to the connection between the logic blocks. For example in FIG. 13, each logic block has four terminals. As FIG. 16 shows, a piece of wire connection information in the wire connection information table 284 is composed of "S2" and "LB1 terminal 1-LB2 terminal 4". This wire connection information shows that the first terminal of the logic block LB1 (221) and the fourth terminal of the logic block LB2 (222) are connected via the switch matrix S2 (232). In concrete terms, "LB1 terminal 1-LB2 terminal 4" is the information showing ON/OFF of each transistor switch included in the switch matrix S2 (323).

Hereinbefore the FPGA of the LUT type has been taken as an example to specifically describe the structure of the reconfigurable unit and the composition of the design data. However, if other type of the reconfigurable circuit is used for the reconfigurable unit, the design data storage unit 203 stores the design data that is written in the suitable format to the structure and the specification of the type of the reconfigurable circuit included in the reconfigurable unit.

4. Specific example of the Device Information

In the above embodiment 1, the device information generation unit 205 transmits the device information that includes the design data of the circuits existing in the reconfigurable unit 201 and the fixed-function logic circuit information. In the embodiment 2, the device information generation unit 802 transmits the device information that further includes the functional conditions necessary to play back an encrypted content.

The design data generation unit 302 in the design data generation apparatus 102 analyzes the design data included in the received device information, and identifies the logic blocks that have not been used for any of the circuits existing in the reconfigurable unit 201 (hereinafter a group of logic blocks that have not been used for the existing circuits is referred to as an "unconfigured area"). The design data generation unit 302 then generates the design data to configure a circuit that satisfies the received functional conditions with use of the identified logic blocks, and transmits the generated design data.

In this case, the design data generation apparatus 102 is, for example, owned by a manufacturer that manufactures the data using device 101, and the design data generation unit 302 is informed in advance of the structure of the reconfigurable circuit included in the reconfigurable unit 201.

Subsequently, the data using device 101 receives the design data that is best suited to the data using device 101 from the design data generation apparatus 102. The data using device 101 then adds the received design data to the design data storage unit 203, and also generates a new circuit in the reconfigurable unit 201 according to the received design data.

The following describes other specific examples of the information to be transmitted as the device information.

(1) Information of the reconfigurable circuit structure

In the above example, the design data generation apparatus 102 is informed in advance of the structure or the scale of the reconfigurable circuit in the data using device 101. Instead, however, the data using device 101 may transmit the device information that shows the structure or the scale of the reconfigurable circuit in the data using device 101.

(2) Information of unconfigured area in the reconfigurable unit

The device information generation unit 205 stores therein, in advance, the information showing the internal structure of the reconfigurable unit 201. Specifically, the device information generation unit 205 stores therein the information such as the number of the logic blocks "9", the identification names of the logic blocks "LB1 to LB9", the arrangement of the logic blocks "a matrix pattern of three by three", the number of the switch matrices "16", and the names of the switch matrices.

When an instruction to update the reconfigurable unit is issued, the device information generation unit 205 reads out the design data from the design data storage unit 203. The structure of the design data is as described above with reference to FIG. 16.

The device information generation unit 205 then reads out, from the configuration LB table included in each piece of the design data, the identification names of the logic blocks that configure the existing circuits. Subsequently, the device information generation unit excludes the read out identification names of the logic blocks from the stored identification names of "LB1 to LB9" to obtain the identification names "LBx, Lby..." (x and y are equivalent to an integer). Then the device information generation unit 205 generates the device information by combining the obtained identification names with the stored information of the internal structure of the reconfigurable unit 201 and the fixed-function logic circuit information. Hereinafter the area in which the existing circuits are being configured is referred to as an "configured area" and the area in which the logic blocks are not used for any of the existing circuits is referred to as an "unconfigured area".

The generated device information is transmitted to the design data generation apparatus 102 via the transmission/reception unit 206.

The design data generation unit 302 in the design data generation apparatus 102 identifies the unconfigured area in the reconfigurable unit 201, based on the identification names "LBx, Lby..." and the information about the internal structure of the reconfigurable circuit included in the received device information. Because of such information, the design data generation unit 302 can generate the design data that enables the data using device 101 to efficiently use the logic blocks in the unconfigured area.

In the same way as above, the device information generation unit 802 in the embodiment 2 also generates the device information that includes the information about the unconfigured area in the reconfigurable unit 201.

Alternatively, instead of the information about the internal structure of the reconfigurable unit 201, the device information may include a name of a manufacturer and a product number of the reconfigurable circuit that constitutes the reconfigurable unit 201. The structure and the logic for circuit design of the reconfigurable circuit that constitutes the reconfigurable unit differ depending on the manufacturer or the circuit scale. Accordingly, based on the name of the manufacturer and the product number, the design data generation unit 302 can identify the structure, the shape and the logic for circuit configuration of the reconfigurable unit, and thus it is possible to generate the best suited design data.

(3) Area management table

In the case of the above specific example (2), it is also possible that the design data storage unit 203 stores therein the information of the internal structure, the configured area and the unconfigured area of the reconfigurable unit 201. The device information generation unit 205 may reads out such information from the design data storage unit 203.

Figure 17:
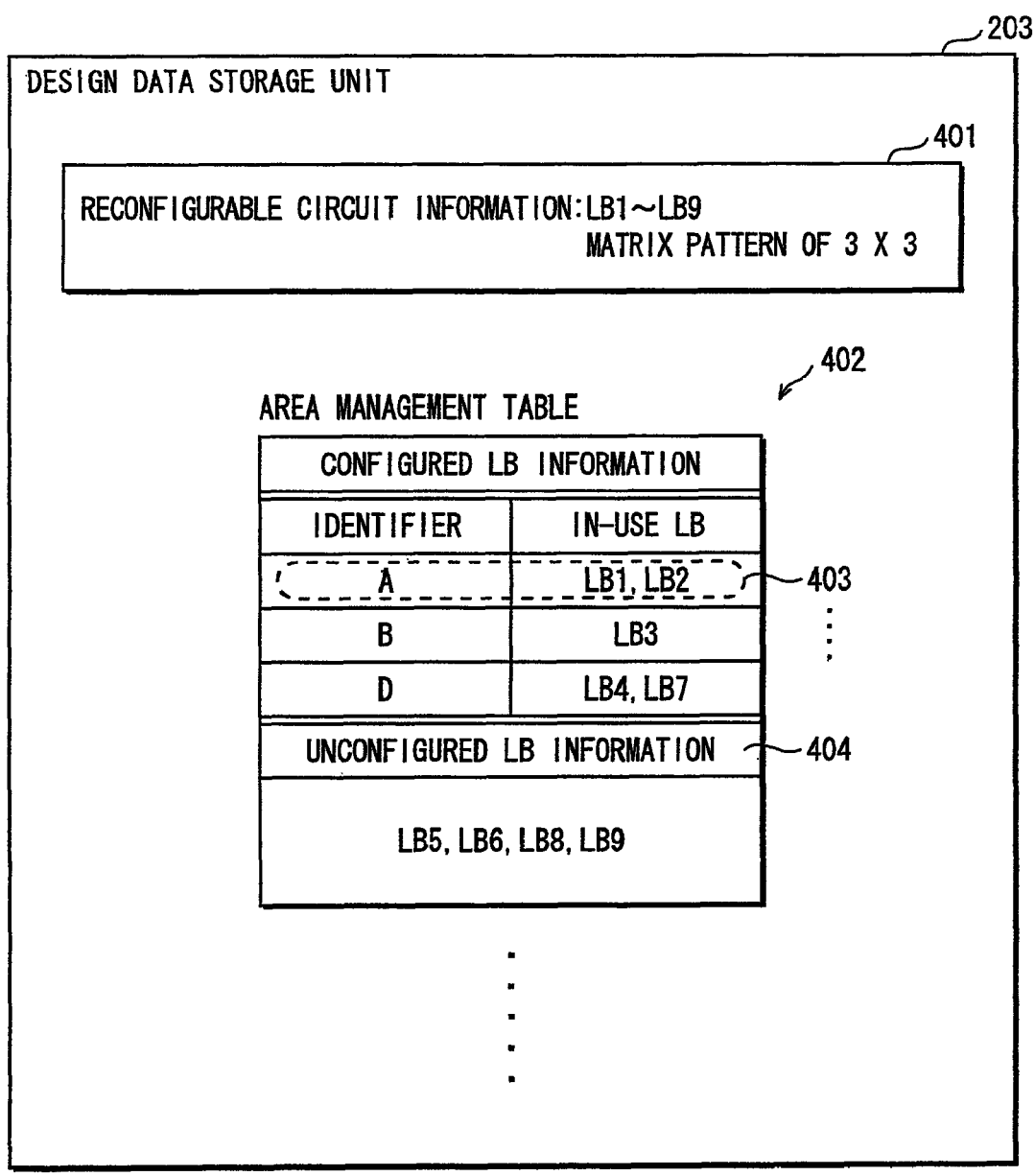
FIG. 17 shows an example of information that a design data storage unit 203 stores.

For example, FIG. 17 shows pieces of information stored in the design data storage unit 203. The design data storage unit 203 stores therein reconfigurable circuit information 401, an area management table 402, and the design data list 210.

The design data list 210 is as described above, and the description thereof is omitted here.

The reconfigurable circuit information 401 shows the internal structure of the reconfigurable circuit that constitutes the reconfigurable unit 201. As an example here, the reconfigurable circuit information in FIG. 17 shows that the reconfigurable circuit contains nine logic blocks LB1 to LB9, and these logic blocks are arranged in the matrix pattern of three by three. In addition to such information, the reconfigurable circuit information may include the information about the switch matrices, the internal structure of each logic block, the manufacturer and the product number of the reconfigurable circuit, and so on.

The area management table 402 shown in FIG. 17 is composed of three pieces of configured LB information 403 ... and a piece of unconfigured LB information 404. Each piece of the configured LB information corresponds to a piece of design data stored in the design data list 210.

Each piece of the configured LB information includes an identifier and identification names of the logic blocks that configure the circuit identified by the identifier. The identifier is the information to identify the circuit that is currently configured by the corresponding design data in the reconfigurable unit 201, and the same identifier is shown in the design data list. An in-use LB shows the identification names of the logic blocks that are being used for the circuit identified by the identifier.

For example, the configured LB information 403 corresponds to the design data A in the design data list 210, and includes the identifier "A" and the in-use LB "LB1 and LB2". Such information indicates that the circuit identified by the identifier "A" is configured using the logic block LB1 and the logic block LB2.

The area that includes the logic blocks indicated in the three pieces of configured LB information is the configured area mentioned above.

Unconfigured LB information 404 shows the identification names of the logic blocks, among the nine logic blocks, that are not being used for any circuits in the reconfigurable circuit 220. In FIG. 17, the unconfigured LB information includes the identification names of four logic blocks, LB5, LB6, LB8 and LB9, that are not being used for any of the circuits of A, B and D. The area that includes these logic blocks is the unconfigured area mentioned above.

When the design data list 210 is updated, the area management table 402 is also updated, based on the updated design data list 210, in order to add or delete the relevant pieces of the configured LB information and to update the unconfigured LB information accordingly.

Also, the area management table 402 is updated when a piece of design data is inputted or existing circuit is reset due to an operation by a user.

Note that such information, that is the information about the internal structure and the configured and the unconfigured area of the reconfigurable unit 201, may be stored in the design data storage unit 203, or stored in a storage unit different from the design data storage unit 203.

In this case, the device information generation unit 205 does not need to store therein the information concerning the reconfigurable circuits. Also, instead of identifying the logic blocks that are not used for any circuit based on the design data included in the design data list, the device information generation unit 205 reads out, from the design data storage unit 203, the reconfigurable circuit information 401 and the unconfigured LB information 404 in the area management table 402. Then the device information generation unit generates the device information that includes the read out reconfigurable circuit information 401 and unconfigured LB information 404, and transmits the generated device information via the transmit/reception unit 206.

The device information generation unit 802 in the embodiment 2 operates in the same way as above.

(4) In the above example (3), the device information may further include pieces of functional information showing the functions of the circuits that exist in the reconfigurable unit 201.

Specifically, each piece of the functional information corresponds to one of the circuits A, B and D that are currently configured in the reconfigurable unit 201. The functional information A is composed of an identifier "A" to identify the circuit A and the information showing the function of the circuit A, for example, a DES cryptography circuit.

The functional information B and D corresponds to the circuits B and D respectively, and each piece of the functional information is composed of the same information as the functional information A. Here, for example, the functional information B is composed of the identifier "B" and "a hash function computing circuit", and the functional information D is composed of the identifier "D" and "a pseudorandom generator".

In this case, the design data generation unit 302 in the design data generation apparatus 102 identifies the functions that are being realized by the existing circuits (the fixed-function logic circuits and the circuits in the reconfigurable unit) in the data using device 101, and generates the design data for configuring the circuits whose functions have not been realized yet, and transmits the generated design data.

With this structure, no circuit is redundantly configured in the data using device 101, and it is possible to efficiently utilize the reconfigurable unit 201.

5. Acquisition of Functional Information Showing Desired Function (1) Although not specifically mentioned in the embodiments above, the data using device transmits the device information and acquires new design data in order to establish the desired function.

For example, the data using device 800 in the embodiment 2 receives an encrypted content via the transmission/reception unit 206. The received encrypted content is accompanied by the functional condition showing the necessary function to play back the encrypted content.

Upon receiving the encrypted content, the functional condition extraction unit 801 extracts the functional condition that has accompanied the encrypted content, and outputs the extracted functional condition to the device information generation unit 802 as the function that the data using device 800 should establish.

The device information generation unit 802 generates the device information that includes the functional condition received from the functional condition extraction unit 801, and transmits the generated device information to the design data generation apparatus 102.

In other words, the data using device 800 demands the function necessary to play back the received encrypted content.

The design data generation unit 302 in the design data generation apparatus 102 generates the design data for configuring a circuit that satisfies the functional condition to play back the encrypted content. Subsequently, the design data generation unit 302 transmits the generated design data to the data using device 800 via the transmission/reception unit 301.

Then the reconfigurable unit 201 in the data using device 800 configures a new circuit (referred to as the circuit E) based on the new design data received via the transmission/reception unit 206. As a result, the data using device 800 establishes therein the function to play back the encrypted content by means of the newly configured circuit E and the existing circuits (the circuits A, B, C and the fixed-function logic circuits).

Note that although the device information includes the fixed-function logic circuit information, the fixed-function logic circuit information is dispensable. Therefore, the function to play back the encrypted content may be established only by the circuits currently configured in the reconfigurable unit 201.

Furthermore, only the unconfigured LB information may be transmitted as the device information, and the function to play back the encrypted content may be established only by the newly configured circuit E.

(2) The data using device 800 in the embodiment 2 extracts the functional condition showing the desired function from the information accompanying the received encrypted content. However, the way to acquire the functional condition is not limited to this.

For example, the functional condition extraction unit 801 identifies a type of a recording medium (such as DVD, BD (blu-ray disc) and SD memory card) attached to the data using device, and outputs the information about the identified type of the recording medium as the functional condition to the device information generation unit. Here, each recording medium conforms to the individual specification, and the data using device cannot obtain the data recorded in the recording medium, unless the data using device performs operations, such as device certification, verification of data falsification and decryption, that are suitable to the attached recording medium prior to obtaining the stored data.

The device information generation unit generates the device information that includes the received functional condition, and transmits the generated device information to the design data generation apparatus.

In other words, here the data using device demands the function to acquire the data recorded in the attached recording medium, depending on the type of the attached recording medium.

(3). Alternatively, instead of the information showing the type of the recording medium, the functional condition extraction unit 801 may output the specific functional condition necessary to obtain the data from the recording medium (for example, a name of a specification to which the recording medium conforms, authentication algorithm and cryptographic algorithm).

In this case, the functional condition extraction unit 801 may store therein, in advance, a correspondence table that associates the types of the recording media that might be attached to the data using device with the functional conditions. Each functional condition shows the necessary condition to obtain data from the associated recording medium. When a recording medium is attached to the data using device 800, the functional condition extraction unit 801 may identify the type of the attached recording medium, read out the corresponding functional condition from the correspondence table, and output the read out functional condition to the device information generation unit.

(4) As other example, the functional condition extraction unit 801 may output the type of the data that the data using device is going to use, for example, MPEG, JPEG and MP3, as the functional condition.

In other words, the data using device here demands the function to use the data that the data using device itself is going to use.

(5) Also as other example, a user may input a function (for example, a name of the function) that he/she desires to newly implement, and the functional condition extraction unit 801 may output the functional condition showing the inputted function to the device information generation unit.

(6) Also, the device information generation unit may judge whether a request for a new design data is necessary or not.

Specifically, the device information generation unit judges whether it is possible to establish the function necessary to use the data recorded in the recording medium attached to the data using device (or the function to play back the received encrypted content) by means of the existing circuits in the data using device, based on the fixed-function logic circuit information and the information about the circuits in the reconfigurable unit acquired from the respective storage units. If the device information generation unit judges that the existing circuits can establish the desired function, the device information generation unit stops transmission of the device information. To the contrary, if the device information generation unit judges that the existing circuits cannot establish the desired function, the device information generation unit transmits the device information to the data using device to demand a new circuit. The device information to be transmitted here includes at least the functional condition that corresponds to the type of the recording medium attached to the data using device (or the functional condition to play back the received encrypted content).

Alternatively, although it is described above that the device information generation unit identifies the type of the attached recording medium and judges if the transmission of the device information is necessary or not, other compositional unit may perform these operations.

For example, the data using device may be equipped with a drive unit (not illustrated) that performs reading and writing of data from/into the recording medium, and the drive unit may identify the type of the recording medium and transmits the identified type.

Also, although the illustrations only show the compositional units relevant to acquisition of the design data, the data using device is equipped with a main control unit that controls the operation of each unit in the data using device and a main storage unit that stores various programs. Accordingly, the main control unit may judge whether the transmission of the device information is necessary or not.

The main control unit here is the computer system that includes a microprocessor, a RAM and a ROM. The RAM and the ROM each store therein various computer programs, and the main control unit achieves a part of the function thereof by the microprocessor operating in accordance with the computer program.

6. Other Modifications (1) In the embodiments of the present invention, the encrypted content is transmitted accompanied by the information shown in FIG. 9. However, the present invention is not limited to this structure. The data using device may retain in advance the necessary conditions to play back the encrypted content depending on the source of the encrypted content. For example, if the encrypted content is to be read from the DVD, the necessary functional conditions are the cryptography algorithm AES and the processing capability 8 Mbps. Furthermore, the data using device may retain and sequentially update the necessary conditions depending on a provider of the encrypted contents, for example in a case where a content is provided from the server A, then another content is provided from the server B.

(2) In addition to the embodiments above, the present invention may be equipped with a request acceptance unit that accepts a request from a user of the data using device. The request acceptance unit may notify the device information generation unit of the information showing the requested hardware circuit (such as a name of the circuit and a function realized by the requested circuit) that the request acceptance unit received. Then the notified information showing the requested hardware circuit is transmitted to the design data generation apparatus via the transmission/reception unit.

(3) In addition to the embodiments of the present invention, deletable/overwritable circuits may be deleted/overwritten or such circuits may be reported to the device information generation unit, based on a certain predetermined rule. For example, the predetermined rule is as follows. A field showing the number of uses is included in the design data list stored in the design data storage unit. A flag "1" is put on a piece of design data whose circuit has never been used during a month, and the device information generation unit is notified of the circuit that is being realized by the flagged design data as the deletable/overwritable circuit.

In this case, the design data generation unit 302 in the design data generation apparatus regards the area on which the notified deletable/overwritable circuit is configured as equivalent to the unconfigured area, that is, the area on which a new circuit can be configured.

In this way, the circuits may be prioritized depending on the number of uses or the history of uses and so on, and the data using device may reset the low-priority circuit in the reconfigurable unit and use the elements (logic blocks and switch matrices) that were included in the reset circuit when configuring a circuit based on the new design data. Or the data using device may overwrite such low-priority circuit in the reconfigurable unit.

Following the above operation, the piece of design data corresponding to the reset or overwritten circuit is deleted from the design data list 210.

Note that the resetting of the circuits depending on the number of uses or the history of uses may be performed at the same time as update of the reconfigurable unit, or at a time different from update of the reconfigurable unit.

(4) In addition to the embodiments of the present invention, the data using device may store information such as a name of a manufacturer or an product number of the reconfigurable unit, and transmit the information showing the name of the manufacturer or the product number of the reconfigurable unit to the design data generation apparatus as the device information.

(5) Although FIG. 2 and FIG. 8 shows only the functional units relevant to acquisition of the design data, the data using device, as described above, further includes a main control unit that controls the operation of each compositional unit in the data using device, a drive unit that accesses a recording medium, a display unit, an input unit that receives an input by a user, and so on. The main control unit is composed of a CPU and a main storage unit that stores therein various kinds of software to be executed by the CPU. Here, in some cases the illustrated fixed-function logic circuits, the circuits existing in the reconfigurable unit and the CPU executing the software may operate in a coordinated way to establish the desired function.

With this structure, the device information generation unit 802 may generate the device information that includes the processing capability of the CPU or the memory size (remaining capacity) to store the software, in addition to the information of the reconfigurable unit (design data and unconfigured LB information), the information of the fixed-function logic circuits, and the functional condition showing the desired function.

In this case, on receiving the device information above, the design data generation apparatus may generate the program for the software and the optimum design data that enables the data using device to utilize both of the software and the hardware for realizing the desired function. Then the design data generation apparatus transmit the generated design data and the program to the data using device. Also, the design data generation apparatus may reproduce the environment of the data using device, and confirm (simulate) whether the generated design data meets the desired performance prior to transmitting the design data.

(6) In the embodiments of the present invention, the data using device receives the design data from the design data generation apparatus that is externally located, and based on the received design data, the data using device configures a circuit in the reconfigurable unit. However, the present invention is not limited to this structure.

For example, the data using device may be equipped with a compilation unit. The data using device may receive original data of the design data from outside, and the compilation unit may compile the received original data to generate the design data. Subsequently, the compilation unit may add the generated design data to the design data list, and the data using device may realize the circuit in the reconfigurable unit based on the compiled design data.

Here, the original data is a procedure, written in the hardware description language (for example, VHDL) or other high-level language (for example, SpecC, System C, or the like), for configuring the circuit having a predetermined function on the reconfigurable unit.

In this case, the data using device may be equipped with an original data storage unit that stores therein the original data, instead of the design data storage unit that stores the design data, or the data using device may be equipped with both of the design data storage unit and the original data storage unit.

(7) Also, the design data storage unit in the data using device may be dispensable, and the device information generation unit may extract the information such as design data and unconfigured LB information from the circuits existing in the reconfigurable unit.

(8) Also, the data using device may be equipped with an input unit that receives an identifier "A" of an unnecessary circuit (as a matter of convenience, referred to as the "circuit A") inputted by a user. The device information generation unit may generate the device information that includes the inputted identifier (or the identification names "LB1 and LB2" that corresponds to the inputted identifier), and transmit the generated device information to the design data generation apparatus.

On receiving the device information, the design data generation unit 302 analyzes the received device information, and generates the optimum design data. Here, the area of the circuit identified by the above identifier is regarded as the unconfigured area.

The data using device then configures the new circuit based on the newly received design data, and here the elements in the circuit A are overwritten by the new design data.

(9) Note that, on receiving the identifier A of the unnecessary circuit (as a matter of convenience, referred to as the "circuit A") inputted by a user, the data using device may reset the circuit A in the reconfigurable unit and delete the design data A from the design data list 210, regardless of the timing of update of the reconfigurable unit. Furthermore, if the data using device has the area management table 402 shown in FIG. 17, the data using device may delete the configured LB information 403, along with the design data A, from the area management table 402, and add LB1 and LB2 to the unconfigured LB information.

With this structure, the unconfigured area can be quickly identified when the instruction to update the reconfigurable unit is issued.

(10) Specifically, each device described above is a computer system that includes a microprocessor, a RAM, a ROM, a hard disk unit, a display unit, a keyboard, a mouse, or the like. The RAM, or the hard disk unit stores therein a computer program. Each device achieves its function by the microprocessor operating in accordance with the computer program. The computer program is composed of a plurality of instruction codes showing instructions to a computer in order to have predetermined functions achieved.

(11) All or apart of the compositional elements of each device described above may be structured from a single system LSI (Large Scale Integration circuit). The system LSI is a super-multifunctional LSI on which a plurality of components are manufactured integrated on a single chip, and in concrete terms it is a computer system that includes a microprocessor, a ROM, a RAM, or the like. The RAM stores therein a computer program. The system LSI achieves its function by the microprocessor operating in accordance with the computer program.

(12) All or a part of the compositional elements of each device described above may be structured from a removable IC card or a single module. The IC card or the module is a computer system that includes a microprocessor, a ROM, a RAM, or the like. The IC card or the module achieves its function by the microprocessor operating in accordance with the computer program. The IC card or the module may be temper-resistant.

(13) The present invention may be a method described above. The present invention may also be a computer program to realize such a method by a computer, or may be a digital signal of the computer program.

The present invention may also be a computer-readable recording medium such as a flexible disk, a hard disk, a CD-ROM, an MO, a DVD, a DVD-ROM, a DVD-RAM, a BD (Blu-ray Disc) and a semiconductor memory, that stores the computer program or the digital signal. Furthermore, the present invention may be the computer program or the digital signal recorded on any of the aforementioned recording media.

The present invention may be the computer program or the digital signal transmitted via a telecommunication line, a wireless or wire communication line, a network represented by the Internet or a data broadcasting.

The present invention may also be a computer system that includes a microprocessor and a memory, and the memory stores therein the computer program, and the microprocessor operates in accordance with the computer program.

The program or the digital signal may be executed on another independent computer system by transferring the program or the digital signal stored in the recording medium, or by transferring the program or the digital signal via the network or the like.

(14) The present invention may be a data using device that uses a content, the data using device comprising: a reconfigurable unit operable to reconfigure design data that realizes a particular function; a device information generation unit operable to generate device information showing an internal state of the data using device including a state of circuit configuration in the reconfigurable unit; a transmission unit operable to transmit the device information generated by the device information generation unit and to require design data; and a reception unit operable to receive the design data required.

(15) The data using device of the modification (14) may further comprise a design data storage unit operable to store therein one or more pieces of design data of one or more circuits currently configured in the reconfigurable unit, wherein the device information may be the one or more pieces of design data stored in the design data storage unit.

(16) The data using device of the modification (15) may further comprise a fixed-function logic circuit storage unit operable to store therein one or more pieces of information of one or more fixed-function logic circuits included in the data using device, wherein the device information may include the one or more pieces of fixed-function logic circuit information, in addition to the one or more pieces of design data.

(17) The data using device of the modification (15) may further comprise a storage unit operable to store therein a name of a manufacture or an product number of the reconfigurable unit included in the data using device, wherein the device information may include such characteristic information of the reconfigurable unit stored in the storage unit, in addition to the one or more pieces of design data.

(18) The data using device of the modification (15) may further comprise a storage unit operable to store therein a remaining capacity of software and a processing frequency of a CPU included in the data using device, wherein the device information may include information relating to the software stored in the storage unit, in addition to the one or more pieces of design data.

(19) The data using device of the modification (15) may further comprise a reception unit operable to receive an encrypted content; and an extraction unit operable to extract, from the encrypted content, content information showing encryption algorithm by which the encrypted content was generated and necessary processing performance to decrypt the encrypted content, wherein the device information may include the content information acquired by the acquisition unit in addition to the one or more pieces of design data.

(20) The data using device of the modification (19), wherein the content information is transmitted together with the encrypted content.

(21) The data using device of the modification (19) may further comprise a storage unit operable to store therein a table showing a correspondence relationship among a provider of the encrypted content, the encryption algorithm and the necessary processing performance to decrypt the encrypted content, wherein the content information may be acquired from the table showing the correspondence relationship stored in the storage unit.

(22) The data using device of the modification (19) may further comprise a storage unit operable to store therein a table showing a correspondence relationship among a recording medium in which the encrypted content is recorded, the encryption algorithm and the necessary processing performance to decrypt the encrypted content, wherein the content information may be acquired from the table of showing the correspondence relationship stored in the storage unit.

(23) The data using device of the modification (15) may further comprise a reception unit operable to receive deletable design data inputted by a user of the content, wherein the device information may include the deletable design data received by the reception unit in addition to the one or more pieces of design data.

(24) The data using device of the modification (15), wherein the design data storage unit may have a storage area that counts and stores the number of uses of each piece of the design data, and the device information may include a piece of the design data whose number of uses is lower than the predetermined value as deletable design data.

(25) The data using device of the modification (14) may further comprise: a compilation unit operable to compile the design data; and a reception unit operable to receive pieces of original data of the design data, wherein the compilation unit may generate the design data based on the device information.

(26) The data using device of the modification (25) may further comprise a design data storage unit operable to store therein one or more pieces of design data of one or more circuits currently configured in the reconfigurable unit, wherein the device information may include the one or more pieces of design data stored in the design data storage unit.

(27) The data using device of the modification (26) may further comprise a fixed-function logic circuit storage unit operable to store therein one or more pieces of information about one or more fixed-function logic circuits included in the data using device, wherein the device information may include the one or more pieces of fixed-function logic circuit information, in addition to the one or more pieces of design data.

(28) The data using device of the modification (26) may further comprise a storage unit operable to store therein a name of a manufacture or an product number of the reconfigurable unit included in the data using device, wherein the device information may include such characteristic information of the reconfigurable unit stored in the storage unit, in addition to the one or more pieces of design data.

(29) The data using device of the modification (26) may further comprise a storage unit operable to store therein a remaining capacity of software and a processing frequency of a CPU included in the data using device, wherein the device information may include information relating to the software stored in the storage unit, in addition to the one or more pieces of the design data.

(30) The present invention may be an update system that includes a data using device that uses a content and a design data generation apparatus that provides design data necessary to use the content, the design data generation apparatus comprising: a reception unit operable to receive the device information from the data using device; a generation unit operable to generate design data based on the received device information; and a transmission unit operable to transmit the generated design data to the data using device, the data using device comprising: a reconfigurable unit operable to reconfigure design data that realize a particular function; a device information generation unit operable to generate device information showing an internal state of the data using device including a state of circuit configuration in the reconfigurable unit; a transmission unit operable to transmit the device information generated by the device information generation unit and to require design data; and a reception unit operable to receive the required design data.

(31) The system of the modification (30), the data using device may further comprise a design data storage unit operable to store therein one or more pieces of design data of one or more circuits currently configured in the reconfigurable unit, wherein the device information may include the one or more pieces of design data stored in the design data storage unit.

(32) The system of the modification (31), the data using device may further comprise a fixed-function logic circuit storage unit operable to store therein one or more pieces of information about one or more fixed-function logic circuits included in the data using device, wherein the device information may include the one or more pieces of fixed-function logic circuit information, in addition to the one or more pieces of design data.

(33) The system of the modification (31), the data using device may further comprise a storage unit operable to store therein a name of a manufacture or an product number of the reconfigurable unit included in the data using device, wherein the device information may include such characteristic information of the reconfigurable unit stored in the storage unit, in addition to the one or more pieces of design data.

(34) The system of the modification (31), the data using device may further comprise a storage unit operable to store therein a remaining capacity of software and a processing frequency of a CPU included in the data using device, wherein the device information may include information relating to the software stored in the storage unit, in addition to the one or more pieces of design data.

(35) The system of the modification (31), the data using device may further comprise a reception unit operable to receive an encrypted content; and an extraction unit operable to extract, from the encrypted content, content information showing encryption algorithm by which the encrypted content was generated and necessary processing performance to decrypt the encrypted content, wherein the device information may include the content information extracted by the extraction unit, in addition to the one or more pieces of design data.

(36) The system of the modification (35), wherein the content information is transmitted together with the encrypted content to the data using device.

(37) The system of the modification (35), the data using device may further comprise a storage unit operable to store therein a table showing a correspondence relationship among a provider of the encrypted content, the encryption algorithm and the necessary processing performance to decrypt the encrypted content, wherein the content information may be extracted from the table showing the correspondence relationship stored in the storage unit.

(38) The system of the modification (35), the data using device may further comprise a storage unit operable to store therein a table showing a correspondence relationship among a recording medium in which the encrypted content is recorded, the encryption algorithm and the necessary processing performance to decrypt the encrypted content, wherein the content information may be extracted from the table showing the correspondence relationship stored in the storage unit.

(39) The system of the modification (31), the data using device may further comprise a reception unit operable to receive deletable design data inputted by a user of the content, wherein the device information may include the deletable design data received by the reception unit, in addition to the one or more pieces of design data.

(40) The system of the modification (31), wherein the design data storage unit in the data using device may have a storage area that counts and stores the number of uses of each piece of the design data, and the device information may include information about a piece of the design data whose number of uses is lower than the predetermined value as deletable design data.

(41) The present invention may be a using method to use a content, the using method comprising: a reconfigurable step of reconfiguring design data that realize a particular function; a using method information generation step of generating using method information showing an internal state including a state of circuit configuration in the reconfigurable step; a transmission step of transmitting the using method information generated by the using method information generation unit and requiring design data; and a reception step of receiving the required design data.

(42) The present invention may be a content using program used in a data using device that uses a content, the data using device comprising a storage unit operable to store therein computer program that controls use of the content, the content using program in the data using device comprising: a reconfigurable step of reconfiguring design data that realize a particular function; a using method information generation step of generating using method information showing an internal state including a state of circuit configuration in the reconfigurable step; and a transmission step of transmitting the device information generated by the using method information generation step and requiring design data.

(43) The content using program of the modification (42) is recorded in a computer-readable recording medium.

(44) The present invention may be an integrated circuit in a data using device that uses content, the integrated circuit comprising: a reconfigurable unit operable to reconfigure design data that realize a particular function; a device information generation unit operable to generate device information showing an internal state of the data using device including a state of circuit configuration in the reconfigurable unit; and a transmission unit operable to transmit the device information generated by the device information generation unit and to require design data.

(45) The present invention may be any combination of the embodiments and the modifications described above.

INDUSTRIAL APPLICABILITY

The present invention can be used for managerially, in other words, repeatedly and continuously, in an industry in which a device capable of updating the algorithm (the function) is manufactured and sold.

The invention claimed is:

1. A device, comprising:
a reconfigurable circuit whose internal circuit structure is reconfigurable;
a generation unit operable to generate circuit information that includes at least area information showing an unconfigured area in the reconfigurable circuit;
a transmission unit operable to transmit, to a design data generation apparatus, (i) the circuit information generated by the generation unit and (ii) functional information showing a function to be established in the reconfigurable circuit after the reconfigurable circuit is reconfigured;
a reception unit operable to receive, from the design data generation apparatus, design data for configuring, in the unconfigured area, a missing circuit that is necessary for configuration of a circuit that realizes the function to be established; and
a configuration unit operable to cause the reconfigurable circuit to configure the circuit that realizes the function to be established based on the design data received by the reception unit.

2. The device of claim 1,
wherein the generation unit generates the circuit information so as to include information showing a function and a structure that are being realized in the reconfigurable circuit, and
wherein the reception unit receives, as the design data, data for configuring, in the unconfigured area, a circuit that is necessary for realizing a function other than the function included in the circuit information generated by the generation unit.

3. The device of claim 2,
wherein the generation unit generates the circuit information so as to include one or more pieces of design data, each of the one or more pieces of design data showing a structure of a different one of one or more circuits currently configured in the reconfigurable circuit.

4. A device, comprising:
a reconfigurable circuit whose internal circuit structure is reconfigurable;
a generation unit operable to generate circuit information that includes at least area information showing an unconfigured area in the reconfigurable circuit;
a transmission unit operable to transmit, to a design data generation apparatus, (i) the circuit information generated by the generation unit and (ii) functional information showing a function to be established in the reconfigurable circuit after the reconfigurable circuit is reconfigured;
a reception unit operable to receive, from the design data generation apparatus, design data for configuring, in the unconfigured area, a missing circuit that is necessary for configuration of a circuit that realizes the function to be established;
a configuration unit operable to cause the reconfigurable circuit to configure the circuit that realizes the function to be established based on the design data received by the reception unit; and
one or more fixed-function logic circuits whose internal structures are not reconfigurable,
wherein the generation unit generates the circuit information so as to include one or more pieces of information, each of the one or more pieces of information showing a function and a structure that are being realized by a different one of the one or more fixed-function logic circuits.

5. The device of claim 4,
wherein the generation unit generates the circuit information so as to include information showing a name of a manufacturer and a product number of the reconfigurable circuit.

6. The device of claim 4,
wherein each of the one or more fixed-function logic circuits includes a CPU and a memory that stores therein one or more programs to be executed by the CPU, and
wherein the generation unit generates the circuit information so as to include, for each of the one or more fixed-function logic circuits, a piece of information showing a processing capability of the CPU and a remaining capacity of the memory.

7. The device of claim 6,
wherein the generation unit generates the circuit information so as to include, for each of the one or more programs stored in the memory, a piece of program functional information showing a function to be realized by the CPU executing the program.

8. The device of claim 4, further comprising:
an acceptance unit operable to accept designation by a user of an unnecessary circuit among one or more circuits currently configured in the reconfigurable circuit,
wherein the generation unit generates the circuit information so as to include information showing an overwritable area in which the unnecessary circuit designated by the user is configured, and
wherein the configuration unit causes the reconfigurable circuit to configure the circuit that realizes the function to be established on an area that includes at least one of the unconfigured area and the overwritable area in the reconfigurable circuit.

9. The device of claim 4, further comprising:
a counting unit operable to count a number of uses of each of one or more circuits currently configured in the reconfigurable circuit,
wherein the generation unit generates the circuit information so as to include information showing a low use area in which a low use circuit is configured, the low use circuit being a circuit whose number of uses counted is less than a predetermined threshold, and
wherein the configuration unit causes the reconfigurable circuit to configure the circuit that realizes the function to be established on an area that includes at least one of the unconfigured area and the low use area in the reconfigurable circuit.

10. The device of claim 4, further comprising:
an acceptance unit operable to accept functional information inputted by a user,
wherein the functional information, transmitted by the transmission unit, includes the functional information inputted by the user.

11. The device of claim 4,
wherein the functional information, transmitted by the transmission unit, shows (i) a decryption algorithm corresponding to an encryption algorithm used for generation of encrypted confidential data that has been inputted to the device and (ii) a necessary processing capability to decrypt the encrypted confidential data.

12. The device of claim 11,
wherein the encrypted confidential data includes functional information and an encrypted copyrighted work generated by encrypting a digital copyrighted work, and
wherein the functional information, transmitted by the transmission unit, includes the function information extracted from the encrypted confidential data.

13. The device of claim 4,
wherein the functional information, transmitted by the transmission unit, shows a necessary function to obtain data recorded in a recording medium attached to the device, depending on a type of the recording medium.

14. The device of claim 13, further comprising:
an identification unit operable to identify the type of the recording medium attached to the device;
a storage unit operable to store therein a functional information table that associates one or more pieces of medium functional information one-to-one with one or more types of recording media that have a possibility to be attached to the device, each piece of the medium functional information showing a function necessary to obtain data recorded in a recording medium of one of the types of the recording media that is associated therewith; and
a read unit operable to read, from the functional information table, a piece of the medium functional information according to the type of the recording medium attached to the device,
wherein the transmission unit transmits the read piece of the medium functional information as the functional information.

15. The device of claim 4, wherein the functional information, transmitted by the transmission unit, shows a type of data inputted to the device.

16. The device of claim 4,
wherein the device is capable of communicating with one or more external apparatuses via a network,
wherein the functional information, transmitted by the transmission unit, shows one or more functions necessary to use data stored in one or more external apparatuses with which the device is going to communicate.

17. The device of claim 16, further comprising:
a storage unit operable to store therein a functional information table that associates one or more pieces of apparatus functional information one-to-one with one or more external apparatuses with which the device has a possibility to communicate, each piece of the apparatus functional information showing a function necessary to use data stored in one of the one or more external apparatuses that is associated therewith; and
a read unit operable to read, from the functional information table, at least one of the one or more pieces of the apparatus functional information according to the one or more external apparatuses with which the device is going to communicate,
wherein the transmission unit transmits the read at least one of the one or more pieces of the apparatus functional information as the functional information.

18. The device of claim 4, further comprising:
an acquisition unit operable to acquire data from outside;
a judgment unit operable to judge whether a function necessary to use the data acquired from the outside is being realized by the one or more fixed-function logic circuits and one or more circuits currently configured in the reconfigurable circuit; and
a control unit operable, only when the judgment unit judges negatively, to (i) instruct the generation unit to generate the circuit information and (ii) instruct the transmission unit to transmit the generated circuit information and the functional information, the functional information showing the function necessary to use the data acquired from the outside.

19. The device of claim 4,
wherein the reception unit receives the design data written in a high-level language from the design data generation apparatus, and
wherein the configuration unit includes:
a conversion sub-unit operable to convert the design data written in the high-level language to design data written in a machine language; and
a configuration sub-unit operable to cause the reconfigurable circuit to configure the circuit that realizes the function to be established therein according to the design data written in the machine language.

20. A function update system comprising a device and a design data generation apparatus,
wherein the device includes:
the reconfigurable circuit whose internal circuit structure is reconfigurable;
a generation unit operable to generate circuit information that includes at least area information showing an unconfigured area in the reconfigurable circuit;
a transmission unit operable to transmit, to the design data generation apparatus, (i) the circuit information generated by the generation unit and (ii) functional information showing a desired function to be established in the reconfigurable circuit after the reconfigurable circuit is reconfigured;
a reception unit operable to receive, from the design data generation apparatus, design data for configuring, in the unconfigured area, a missing circuit that is necessary for configuration of a circuit that realizes the function to be established;
a configuration unit operable to cause the reconfigurable circuit to configure the circuit that realizes the function to be established based on the design data received by the reception unit;
one or more fixed-function logic circuits whose internal structures are not reconfigurable,
wherein the generation unit generates the circuit information so as to include one or more pieces of information, each of the one or more pieces of information showing a function and a structure that are being realized by a different one of the one or more fixed-function logic circuits, and
wherein the design data generation apparatus includes:
a reception unit operable to receive the circuit information and the functional information from the device;
a design data generation unit operable to generate the design data showing the structure of the circuit that realizes the function to be established based on the circuit information and the functional information; and
a transmission unit operable to transmit the design data generated by the design data generation unit to the device.

21. A function update method used in a device that includes a reconfigurable circuit whose internal circuit structure is reconfigurable, the function update method comprising:
a generation step of generating circuit information that includes at least area information showing an unconfigured area in the reconfigurable circuit;
a transmission step of transmitting, to a design data generation apparatus, (i) the circuit information generated by the generation step and (ii) functional information showing a function to be established in the reconfigurable circuit after the reconfigurable circuit is reconfigured;

a reception step of receiving, from the design data generation apparatus, design data for configuring, in the unconfigured area, a missing circuit that is necessary for configuration of a circuit that realizes the function to be established; and a configuration step of causing the reconfigurable circuit to configure the circuit that realizes the function to be established based on the design data received by the reception step, wherein the device includes one or more fixed-function logic circuits whose internal structures are not reconfigurable, and wherein the generation step generates the circuit information so as to include one or more pieces of information, each of the one or more pieces of information showing a function and a structure that are being realized by a different one of the one or more fixed-function logic circuits.

22. A non-transitory computer readable recording medium having stored thereon a function update program used in a device that includes a reconfigurable circuit whose internal circuit structure is reconfigurable, wherein, when executed, the function update program causes the device to perform a method comprising:

a generation step of generating circuit information that includes at least area information showing an unconfigured area in the reconfigurable circuit;

a transmission step of transmitting, to a design data generation apparatus, (i) the circuit information generated by the generation step and (ii) functional information showing a function to be established in the reconfigurable circuit after the reconfigurable circuit is reconfigured;

a reception step of receiving, from the design data generation apparatus, design data for configuring, in the unconfigured area, a missing circuit that is necessary for configuration of a circuit that realizes the function to be established; and a configuration step of causing the reconfigurable circuit to configure the circuit that realizes the function to be established based on the design data received by the reception step, wherein the device includes one or more fixed-function logic circuits whose internal structures are not reconfigurable, and wherein the generation step generates the circuit information so as to include one or more pieces of information, each of the one or more nieces of information showing a function and a structure that are being realized by a different one of the one or more fixed-function logic circuits.

23. An integrated circuit that is mounted on a device, comprising:

a reconfigurable circuit whose internal circuit structure is reconfigurable;

a generation unit operable to generate circuit information that includes at least area information showing an unconfigured area in the reconfigurable circuit;

a transmission unit operable to transmit, to a design data generation apparatus, (i) the circuit information generated by the generation unit and (ii) functional information showing a desired function to be established in the reconfigurable circuit after the reconfigurable circuit is reconfigured;

a reception unit operable to receive, from the design data generation apparatus, design data for configuring, in the unconfigured area, a missing circuit that is necessary for configuration of a circuit that realizes the function to be established;

a configuration unit operable to cause the reconfigurable circuit to configure the circuit that realizes the function to be established based on the design data received by the reception unit;

one or more fixed-function logic circuits whose internal structures are not reconfigurable, wherein the generation unit generates the circuit information so as to include one or more pieces of information each of the one or more nieces of information showing a function and a structure that are being realized by a different one of the one or more fixed-function logic circuits.

* * * * *